United States Patent
Krumpholz

(10) Patent No.: US 11,131,696 B2
(45) Date of Patent: Sep. 28, 2021

(54) METHOD FOR ESTIMATING A SIGNAL PROPERTY

(71) Applicant: Delta Electronics (Thailand) Public Co., Ltd., Samutprakarn (TH)

(72) Inventor: Christian Krumpholz, Freiburg (DE)

(73) Assignee: DELTA ELECTRONICS (THAILAND) PUBLIC CO., LTD., Samutprakarn (TH)

( * ) Notice: Subject to any disclaimer, the term of this patent is extended or adjusted under 35 U.S.C. 154(b) by 68 days.

(21) Appl. No.: 16/240,347

(22) Filed: Jan. 4, 2019

(65) Prior Publication Data

US 2019/0212376 A1    Jul. 11, 2019

(30) Foreign Application Priority Data

Jan. 8, 2018 (EP) .................................. 18 150 641

(51) Int. Cl.
*G01R 19/25* (2006.01)
*G01R 19/165* (2006.01)
(Continued)

(52) U.S. Cl.
CPC ....... *G01R 23/12* (2013.01); *G01R 19/16566* (2013.01); *G01R 19/175* (2013.01);
(Continued)

(58) Field of Classification Search
CPC .............. G01R 23/12; G01R 19/16566; G01R 19/175; G01R 19/2506; G01R 19/2513; G01R 23/02; G01R 23/14
See application file for complete search history.

(56) References Cited

U.S. PATENT DOCUMENTS 4,037,151 A * 7/1977 Takeuchi ............... G01R 23/02
324/76.33
5,834,930 A * 11/1998 Hung ................... G01R 19/175
324/76.58
(Continued)

FOREIGN PATENT DOCUMENTS

EP       1 085 328 A2   3/2001
GB       2528847 A      2/2016
(Continued)

OTHER PUBLICATIONS

Feng Zhou et al., "Time-Domain Quasi-Synchronous Sampling Algorithm for Harmonic Analysis Based on Newton's Interpolation", IEEE Transactions on Instrumentation and Measurement, vol. 60, No. 8, Aug. 1, 2011, pp. 2804-2812.
(Continued)

*Primary Examiner* — Tung X Nguyen
*Assistant Examiner* — Feba Pothen
(74) *Attorney, Agent, or Firm* — Vector IP Law Group LLC; Robert S. Babayi

(57) ABSTRACT

A method for estimating a property of a signal (1) sensed in an electrical system, comprises the steps of sensing the signal (1) and estimating a fundamental period of a fundamental of the signal (1) by comparing the sensed signal (1) with at least one threshold (2) to detect threshold crossings and estimating the fundamental period from the threshold crossings. The signal property is then estimated from the fundamental period and/or from the sensed signal (1) during an interval of a length of the fundamental period.
An electronic device according to the invention comprises a micro controller and/or an analogue circuitry which performs the method for estimating a property of a signal. Preferably, the micro controller and/or analogue circuitry
(Continued)

controls other parts of the electronic device depending on the results obtained by the method for estimating a property of a signal.

19 Claims, 6 Drawing Sheets

(51) Int. Cl.
    *G01R 23/02*     (2006.01)
    *G01R 19/175*     (2006.01)
    *G01R 23/12*     (2006.01)
    *G01R 23/14*     (2006.01)

(52) U.S. Cl.
    CPC ..... *G01R 19/2506* (2013.01); *G01R 19/2513* (2013.01); *G01R 23/02* (2013.01); *G01R 23/14* (2013.01)

(56) References Cited

U.S. PATENT DOCUMENTS

| | | |
|---|---|---|
| 7,203,229 B1 | 4/2007 | Ishida et al. |
| 9,548,650 B1 | 1/2017 | Kim et al. |
| 2004/0178936 A1* | 9/2004 | Lee .......................... H03L 7/091 |
| | | 341/120 |
| 2006/0077602 A1* | 4/2006 | Masino .................... H02J 1/10 |
| | | 361/84 |
| 2011/0080197 A1 | 4/2011 | Fan et al. |
| 2012/0274311 A1* | 11/2012 | Antonesei .............. G01R 23/12 |
| | | 324/76.52 |
| 2016/0261201 A1* | 9/2016 | Tao ................... H02M 3/33523 |

FOREIGN PATENT DOCUMENTS

| | | |
|---|---|---|
| JP | 2003-108185 A | 4/2003 |
| WO | 2013/041831 A1 | 3/2013 |
| WO | 2017/119368 A1 | 7/2017 |

OTHER PUBLICATIONS

Miodrag D. Kusljevic, "A Simultaneous Estimation of Frequency, Magnitude, and Active and Reactive Power by Using Decoupled Modules", IEEE Transactions on Instrumentation and Measurement, vol. 59, No. 7, Jul. 1, 2010, pp. 1866-1873.

Saeed Mian Qaisar et al., "Spectral Analysis of a Signal Driven Sampling Scheme", 2006 14th European Signal Processing Conference (EUSIPCO 2006), Florence, Italy, 4 Sep. 4-8, 2006, 5 pages.

Dusan Agrez, "Power System Frequency Estimation in the Shortened Measurement Time", IEEE Instrumentation and Measurement Technology Conference, Budapest, Hungary, May 21-23, 2001, pp. 1094-1098.

European Search Report dated Jul. 3, 2018, 12 pages.

\* cited by examiner

METHOD FOR ESTIMATING A SIGNAL PROPERTY

TECHNICAL FIELD

The invention relates to method for estimating a signal property of a signal and a device which uses this method to adapt itself to changing signal properties.

BACKGROUND ART

There are basically two known methods for estimating signal properties like e.g. an effective voltage of a varying voltage.

First of all it is possible to observe the measured signal over a time which is longer than a few times the highest reasonable estimate for a fundamental period. Assuming a regular oscillation, the observation includes as a result a number of completed oscillations and a part of a further oscillation. For good estimates, the contribution from this partial oscillation should be neglectable compared to the measurements from the completed oscillations.

While this method is easy to implement, it is slow. This is emphasized if the fundamental frequency is unknown and might be low, as one needs to assume the lowest reasonable frequency for this method.

The second method is the use of a Fourier transform, e.g. a FFT algorithm. This method can give very precise results but needs a significant amount of computing power and again it will be difficult to obtain reasonable estimates for signal properties in a timeframe smaller than a few periods of the lowest reasonable frequency.

SUMMARY OF THE INVENTION

It is therefore the object of the invention to create a method for estimating a signal property which is fast, computationally easy and reliable over a wide range of fundamental frequencies.

The solution of the invention is specified by the features of claim 1. According to the invention, the signal is sensed and a fundamental period of a fundamental of the signal is estimated by comparing the sensed signal with at least one threshold to detect threshold crossings, estimating the fundamental period from the threshold crossings and estimating the signal property from the fundamental period and/or from the sensed signal during an interval of a length of the fundamental period.

"Sensing" a signal can be a measurement conducted with a measurement device like an analogue or digital volt- or ampere-meter or another method of gaining the desired signal property. For example comparators or other electronic components could be used to detect if a threshold is crossed or not and for example a circuitry with a capacitance and diodes could be used to save a maximum voltage occurring between two threshold crossings, if the signal is a voltage. Therefore, "sensing" in the sense of this document does not require the presence of a traditional measurement device. However, sensing the signal with a measurement device is a preferred embodiment as it allows the use of of-the-shelf-components and increases the flexibility.

The signal whose properties should be estimated by this method is a priori unknown. It can be a fluctuating signal with only one sign, it can be a rectified signal, it can be a constant signal or an alternating signal. However, it should be possible to assume that if there is some sort of fluctuation, that this pattern repeats itself at least approximately and at least a few times, e.g. more than two times. For the ease of explanation, this signal will be approximated by a sum of sinusoidal waveforms with different amplitudes and frequencies. The frequencies should all be integer-multiples of one lowest frequency: The sinusoidal waveform with the lowest frequency will be called "fundamental" in the following. It has a fundamental frequency, a fundamental period and a fundamental amplitude. The other frequencies will be called "harmonics" of this fundamental. This sum of sinusoidal waveforms may be rectified, added to a constant signal value and/or stopped and started again. All parameters may change which time, but these changes are preferably slow compared to the fundamental period.

The invention is not restricted to signals which fit perfectly in this model. However, best results will be archived if this model is a reasonable approximation. If a signal does not fit well in the model, the lowest frequency of it will be assumed to be the fundamental. In one embodiment, a lower limit frequency or an upper limit period and in cases where no fundamental is detected with a frequency larger than this lower limit frequency, the fundamental frequency is set to the lower limit frequency and the fundamental period is set to the upper limit period.

A simple way to estimate the fundamental frequency from threshold crossings of a sensed signal is to assume that the threshold is crossed twice or four times during one period. Therefore the difference in time between a first and a third threshold crossings in the case of a non-rectified signal, respectively a first and a fifth threshold crossing in the case of a rectified signal is an estimate for the fundamental period. To estimate a signal property, one observes the signal during an interval of the length of this estimated fundamental period. To estimate e.g. the peak value of the signal one can compare the momentary signal with the highest signal value measured since a beginning until the end of the estimated fundamental period. To estimate e.g. the fundamental frequency one may calculate the reciprocal of the already estimated fundamental period. To estimate a mean signal value one may integrate the rectified signal or the square of the signal or the signal itself over the time of one fundamental period and divide the result by the fundamental period. Further signal properties can be estimated with similar methods by sensing the signal over only one fundamental period and/or by using the estimated fundamental period.

Instead of simply assuming that a fixed number of threshold crossings occur during one fundamental period, one may also observe the distribution of threshold crossings over time. This is one way to improve the method in cases where the signal comprises harmonics or noise besides the fundamental.

In one embodiment, the signal property is estimated more than once. The signal property is in all cases estimated with the method of claim 1 but at different times. Thereby a multitude of signal property estimates are gained. These estimates are averaged in order to improve the reliability of the estimate of the signal property.

Averaging estimated signal properties reduces errors due to wrongly estimated fundamental periods.

In one embodiment, the sensed signal is compared with two or more thresholds in order to detect threshold crossings. Preferably, the direction of the crossing of at least one of the thresholds is detected.

For the purpose of this application, the direction of a threshold crossing is defined as being positive if the previous value is below the threshold and the following value is equal or greater than the threshold. And the direction of a threshold crossing is defined as being negative if the previous value is greater than the threshold and the following value is below or equals the threshold.

This is another way to improve the method in cases where the signal comprises harmonics or noise besides the fundamental. If the thresholds are chosen wisely, it becomes unlikely that a harmonic or noise causes the signal to cross both thresholds. By detecting a crossing of multiple thresholds in an expected sequence it is easier to separate threshold crossings due to harmonics and noise from threshold crossings due to the fundamental. Detecting the direction of a threshold crossing improves the method even further as oscillations around a single threshold, e.g. caused by noise or harmonics, can be easily detected.

In one embodiment, at least one threshold crossing and preferably its direction are associated with a weighting factor and this weighting factor changes a tracker variable. In this way, threshold crossings can be easily recorded with a minimum of storage. This reduces the requirements for the devices which carry out the method.

In one embodiment the method for estimating a property of a signal x(t) sensed in an electrical system, preferably in a switch mode power supply comprises the steps of
  a) initializing a tracker variable with a starting value when the signal crosses a first threshold in a first direction,
  b) modifying the value of the tracker variable by a first mathematical operation linking a first weighting value and the value of the tracker variable when the signal crosses a second threshold in the first direction,
  c) modifying the value of the tracker variable by a second mathematical operation linking a second weighting value and the value of the tracker variable when the signal crosses the second threshold in a second direction,
  d) defining at least two points of time at which the value of the tracker variable fulfils a trigger-condition and
  e) estimating the signal property based on
    a. a distance in time $D_i$ between two subsequent points of time $E_i$, $E_{i-1}$ which is defined as $D_i=E_i-E_{i-1}$ and/or
    b. the signal x(t) sensed between the two subsequent points of time $E_i$, $E_{i-1}$ In one embodiment, the tracker variable is locked when the signal crosses the first threshold in the second direction. The value of a locked tracker variable cannot be modified until it is unlock again. Preferably, initializing the tracker variable unlocks it. Unlocking, without initialization, does not change the value of the tracker variable according to this invention but allows that the value of the tracker variable is changed in the future. Initialization of the tracker variable sets its value to the starting value and allows this value to be changed according to this invention.

For the purpose of the invention, a trigger-condition is a mathematical condition which allows to determine if it is fulfilled by a value of the tracker variable or not. Examples are "grater/smaller/equal to a comparison value", "positive", "negative", "integer result if divided by 5", "includes the prime factor 3" and so on.

Recognising a threshold crossing and its direction is computationally easy. The same is true for setting a variable to a starting value and for simple mathematical operations, like e.g. an addition of given numbers to a variable. Also checking if a tracker variable fulfils a trigger-condition does not need great computational power for many choices of trigger-conditions. Therefore the inventive method needs only little computational power and can even be realised by an analogue circuitry alone: For example when the signal is a voltage signal, the tracker variable may be represented by a voltage over a capacitor or a charge counting device. Comparators can be used to detect the threshold crossings and their direction if the trigger-condition is fulfilled.

Depending on which signal property one is interested in, either the distance in time between two "points of time" is of interest or the signal values measured in between these two points of time or both.

A point of time is the moment in which the tracker variable fulfils the trigger-condition for the first time before not fulfilling it anymore. The distance between two points of time can be used to estimate the fundamental frequency of the signal. The signal values measured between two points of time can be used to estimate the peak signal value. The distance between two points of time together with the signal values measured in between them can be used to estimate the effective or a mean signal.

For the purpose of this invention, the signal can be sensed continuously or in samples. Samples are signal measurements at single points in time. Preferably, samples are taken in a constant distance in time from each other. This sample period, i.e. the distance in time between two subsequent samples, can be used as a time unit. The reciprocal of the sample period is the sample frequency. According to the Nyquist-Theorem, the sample frequency determines the highest lossless measurable signal frequency which is 0.5 times the sample frequency. In one embodiment, the minimum distance $D_{min}$ is set to the reciprocal of 0.5 times the sample frequency or vice versa. If the signal is sensed continuously it is preferably evaluated in short distances in time. However, especially with an analogue circuitry, also a continuous evaluation is possible.

If the signal changes from one sample to the next more than expected, this is called a jump. One possibility is to define a jump is a sudden change in the signal which leads to two subsequent signal measurements being separated by more than one threshold. Another possibility is to define a jump as a signal change which is larger than a maximum signal change value, e.g. larger than 10% of the expected peak signal value or larger than a fixed value (e.g. 50V for a signal being a voltage signal). A third possibility is to define a jump as a signal change which crosses more than one threshold or which is larger than a maximum signal change value and which occurs in a short time. This short time can be for example the reciprocal of an assumed maximum frequency or a fraction of this value.

A jump can be handled as if no thresholds were crossed: These jumps do not influence the tracker variable. This can be beneficial for example if the tracker variable is locked and unlocked at some threshold crossings. In contrast to this option, a jump can also be treated as a sequence of threshold crossings.

The basic idea of using two or more thresholds, instead of only one, is that one can distinguish between oscillations around only one of the thresholds and oscillations around more than one threshold. Oscillations around more than one threshold, preferably all thresholds, are assumed to be an indication for the fundamental frequency of the signal.

Oscillations around the first threshold only set the tracker variable again and again on its starting value. The starting value should not fulfil the trigger-condition. Oscillations around the second threshold should cause the tracker variable to fulfil the trigger-condition with the first crossing, either in positive or in negative direction. However, every further oscillation around the second threshold should cause the tracker variable to have a value which does not fulfil the trigger-condition again until the tracker variable is set back to its starting value by a crossing of the first threshold in the first direction. There may be the need for a third or even more thresholds to be crossed between the first and the second threshold in order to have a tracker variable value which fulfils the trigger-condition in the first oscillation around the second threshold.

Preferably the trigger-condition is such that a point of time is only detected when it is fulfilled for the first time after being not fulfilled. In this case a tracker variable value which keeps fulfilling the trigger-condition causes the detection of only a single point of time.

A first example of an embodiment comprises two thresholds: The tracker variable is set to 0 at the positive crossing of the first threshold and 1 is added to the tracker variable at both, the positive and the negative crossing of the second threshold. The trigger-condition is either "tracker variable=1" or "tracker variable=2" or "first occurrence of tracker variable ≥1" or "first occurrence of tracker variable ≥2".

A second example comprises three thresholds: The tracker variable is set to −1 at the negative crossing of the first threshold and 3 are added to the tracker variable at both, the positive and the negative crossing of the third threshold. On the positive crossing of the second threshold, the tracker variable is multiplied by (−1) and on the negative crossing of the second threshold the tracker variable is multiplied by 0 or set to 0. The trigger-condition is "tracker variable ≤−2". In this case it is assumed that the first threshold is at a lower signal value than the second threshold but at a higher signal value than the third threshold.

A third example comprises three thresholds, The starting value is 1 and to each positive and negative crossing of the second, third and following threshold, a different prime number is assigned as weighting value. The mathematical operations are all multiplication. The threshold-relationship is fulfilled if the prime factorization shows that all of the desired threshold crossings have occurred at least as often as desired.

A suitable set of thresholds, weighting values and mathematical operations can be easily found like this:

1. Place the thresholds at, for a given situation, significant signal levels: e.g. two thresholds at 10% and 90% of the peak signal value.
2. Define the condition at which a point of time should be found: E.g. "first positive crossing of the second threshold after a positive crossing of the first threshold and at least one positive crossing of a third threshold".
3. Decide how jumps should be treated and what a jump should be. E.g. jumps should not change the tracker variable and a jump is a change of more than 10% of the peak signal value between two samples or during the time of a tenth of the minimum distance $0.1\ D_{min}$.
4. If in the definition according to point 2 leaves it open if a threshold is crosses once or more or if a threshold crossing should not influence the result according to the definition of point 2, then it does not play a role how many times a given threshold is crossed. In this cases, the two mathematical operations together with their weighting values for the positive and negative crossing applied one after the other on an input value should yield this input value (e.g.: an addition and subtraction of the same weighting value or multiplication and division of the same weighting value).
5. If in the definition according to point 2 a threshold should be crossed exactly a given number of times before a point of time is detected, it does play a role how many times a given threshold is crossed. In this case, the two mathematical operations together with their weighting values for the positive and the negative crossing applied one after another on an input value should NOT yield this input value (e.g. two additions of a positive value, two multiplications of a value greater than 1, an addition a first value and a subtraction of a second value, different from the first).
6. Chose a starting value and simulate the tracker variable values which can occur due to oscillations around any one of the thresholds, due to oscillations around two or more neighbouring thresholds and due to jumps. Preferably, the starting values and the weighting values can be represented by variables in this step.
7. From these simulation results, chose numerical values for the starting value and the weighting values and set the trigger-condition.

As the second and third example given above show, there are also further possibilities to set weighting values, mathematical operations and trigger-conditions which cannot be found with this manual but which fall anyway under claims 1 and 2.

In one embodiment, the method comprises the step of integrating a function $f(x(t))$ over the time between two points of time $E_n$, $E_m$: $\int_{E_m}^{E_n} f(x(t))\,dt$. The function f depends on the signal $x(t)$. Preferably the function is equal to the signal $f(x(t))=x(t)$ or the signal squared $f(x(t))=x(t)^2$. The preferred integrals are therefore: $\int_{E_m}^{E_n} x(t)\,dt$ or $\int_{E_m}^{E_n} x(t)^2\,dt$.

These results allow estimating the effective signal or the mean signal. Including the evaluation of these integrals in the method allows saving storage: For the integral $\int_{E_m}^{E_n} x(t)\,dt$, one may simply start a variable at the point of time $E_m$ and keep on adding the sampled signal values multiplied with the distance in time between this sample and the next one. This addition stops at the point of time $E_n$. Thereby only a single variable is needed for this evaluation while saving all sampled signal values between the two points of time together with the distances between the samples needs much more storage. Further, evaluating the integrals in this way returns the desired signal property in a very short time.

For other integrals of functions depending on the signal $x(t)$, the integration can be done in a similar way: the only difference is, that the function is executed on the sampled signal value before it is multiplied with the distance in time between this sample and the next and adding this result to the variable.

If the sampling frequency of the signal is constant between the two points in time, one may also simply add up the values of the function to be integrated executed on the sampled signal values and multiply this sum by the sampling frequency. Setting the sampling frequency to one, i.e. measuring the time in units of the distance between two samples, makes even this multiplication superfluous.

Calculating integrals of functions depending on the signal $x(t)$ is however not necessary if they are not needed for estimating the desired signal property. This is the case for signal properties like the fundamental frequency, the amount of harmonic content H or the peak signal and others.

In one embodiment, the second weighting value WF2 and/or the second mathematical operation $g(WF2,*)$ are chosen such that applying the second mathematical operation $g(WF2,*)$ on the second weighting value WF2 and the result of applying the first mathematical operation $f(WF1,*)$ on the first weighting value WF1 and a test value x does not yield the test value x: $x \neq g(WF2, f(WF1, x))$ In one embodiment, the first and the second mathematical operation are the same. Preferably the first and the second mathematical operation are both an addition of the weighting value and the value of the tracker variable.

The first and the second mathematical operation being the same makes the method computationally easier as only a minimum number of mathematical operation need to be feasible for the device. However, there may be situations in which a combination of two different operations has advantages: e.g. multiplying once by 3 at a threshold crossing in the one direction and multiplying the tracker variable with ⅓ at a threshold crossing in the opposite direction may be more vulnerable to numerical errors then using a division by 3 instead of the multiplication with ⅓.

Further, there can be embodiments in which the two mathematical operators need to be different to get the desired result. For example a positive threshold crossing can change the tracker variable by an addition of a first weighting value while a negative threshold crossing changes the tracker variable by a multiplication with a second weighting value.

Additions are simple and fast operations from a computational point of view. However, other basic mathematical operations like subtractions, multiplications and divisions are also possibilities with similar advantages. But also operations like "finding a division remainder", a logarithm, "rounding a division result", "setting a fixed value" and so on can be used. Also combinations of all of these examples are possible mathematical operations: e.g. addition of a weighting value and a multiplication with two or dividing the tracker variable by two, rounding the result to whole numbers and multiplying this result by two again.

In one embodiment, the trigger-condition is the equality of the value of the tracker variable to a comparison value.

Equality is computationally easy and fast to test.

Other options which have similar advantages are "greater than", "smaller than", "greater or equal" and "smaller or equal". However, in many cases these trigger-conditions need to be further specified by fulfilling this relationship for the first time since it was the last time not fulfilled.

Further the trigger-condition can be more complex. For example one may test if the tracker variable is odd or if its prime factorization includes a given set of prime numbers like 2 and 3. This may give further options in controlling which thresholds were crossed and how many times this has happened.

In one embodiment of the method the first and the second threshold are both at a positive signal value and the first threshold is greater than the second threshold. Further, the first direction is negative and the second direction is positive. Preferably, the sum of the first weighting value and the second weighting value is not equal to zero. Preferably, the comparison value of the trigger-condition is equal to the first weighting value. Preferably, the first and the second mathematical operation are both additions and preferably the trigger-condition is the equality of the comparison value and the value of the tracker variable.

This embodiment has the advantage to be computationally easy and fast. It can be used for both rectified and alternating signals.

As the first threshold is the greater one and the first direction is negative, the tracker variable gets its starting value at the crossing of higher threshold in negative direction. The detection of a point of time happens at a threshold with a lower signal value.

To illustrate how starting values and weighting factors can be determined, assume the following embodiment. In the following, the starting value will be called SV, the first weighting value WF1 and the second weighting value WF2.

An oscillation around the first threshold, having the greater signal value, keeps the tracker variable at its starting value.

An oscillation around the second threshold gives one of the following sequences:
i) SV+WF1, SV+WF1+WF2, SV+2×WF1+WF2; SV+2× WF1+2×WF2, . . .
ii) WF1, WF1+WF2, 2×WF1+WF2; 2×WF1+2× WF2, . . .
iii) SV+WF2, SV+WF2+WF1, SV+WF1+2×WF2; SV+2×WF1+2×WF2, . . .
iv) WF2, WF1+WF2, WF1+2×WF2; 2×WF1+2× WF2, . . .

Which one of these four sequences occurs, depends on the starting conditions of the oscillation around the second threshold.

Sequence i) occurs if the first threshold was crossed in the negative direction before the crossing of the second threshold and if the first crossing of the second threshold is in the negative direction. A crossing of the first and then the second threshold in the same direction is what one often wants to detect to define a "point of time". It does not play a role if the first positive or the first negative crossing of the second threshold determines the "point of time". Therefore, the comparison value of the trigger-condition may be set to SV+WF1 or SV+WF1+WF2.

Sequence ii) occurs if there was no negative crossing of the first threshold before the first crossing of the second threshold and this second threshold crossing is in a negative direction. This situation may occur at the beginning of the measurement. No matter if a "point of time" is detected or not, it will not influence the analysis in the long run. However, we assume here that no "point of time" should be detected.

Sequence iii) occurs if the first crossing of the second threshold after a negative crossing of the first threshold is in positive direction. In other words: The signal must have jumped from between the two thresholds to a value below the second threshold without crossing the second threshold. This may occur if jumps should not be treated as sequences of threshold crossings. Such a situation indicates most likely some kind of error or problem and we assume here that no "point of time" should be detected.

Sequence iv) occurs if there was no negative crossing of the first threshold and the first crossing of the second threshold is positive. This situation may occur at the beginning of the measurement. No matter if a "point of time" is detected or not, it will not influence the analysis in the long run. However, we assume here that no "point of time" should be detected.

Looking at the possible comparison values of the trigger condition, sequence i) offers SV+WF1 or SV+WF1+WF2. As SV+WF1+WF2 occurs also at the beginning of sequence iii) where no point of time should be detected, choosing the comparison value to be SV+WF1 is probably the best option.

The numerical values SV, WF1 and WF2 should be chosen such that the comparison value cannot be reached by "accident" through another addition of SV and multiples of WF1 and WF2.

Setting SV to 1, WF1 to 2 and WF3 to 4 solves for example this problem: The comparison value is set to 3. As soon as WF3 occurs in a sum, this sum is for sure greater than the comparison value. SV or WF1 alone are too small to reach the comparison value. SV can only occur once in a sum. Two or more occurrences of WF1 yield a sum which is greater than the comparison value.

In one embodiment, the first and the second mathematical operation do not fulfil the associative law together with their weighting values.

Assume that a "point of time" should be detected at the first positive threshold crossing of the second threshold after a negative first threshold crossing. This means that the comparison value should be SV+WF1+WF2. This value was however discarded earlier as it happens also in sequence iii) where no "point of time" should be detected. This problem can be solved if the two mathematical operations do not fulfil the associative law. For example if the SV=1, WF1=2 and WF2=4 and the first mathematical operation is a multiplication and the second mathematical operation is an addition, the first elements of the four possible sequences are:

i) 1*2=2, 2+4=6, 6*2=12, . . .
ii) 0*2=0, 0+4=4, 4*2=8, . . .
iii) 1+4=5, 5*2=10, 10+4=14, . . .
iv) 0+4=4, 4*2=8, 8+4=12, . . .

Therefore setting the comparison value of the trigger-condition to 6 finds the "point of time" at the desired spot.

We assumed here in both examples that the tracker variable already exists before it is set to its starting value and that it has the value 0. This is one option. It is also possible that the tracker variable does not exist or that it cannot be changed until it is set to its starting value. In these cases, the sequences ii) and iv) do not exist either.

Assume that the first negative crossing of the second threshold after a negative crossing of the first threshold is searched for and that the tracker variable can only be changed after it is set to its starting value. The first and the second mathematical operations are additions. In this embodiment, sequences ii) and iv) do not exist. Therefore the trigger-condition can be chosen to be "tracker variable equals first weighting value" if the first weighting factor is not equal to the second weighting factor and if the starting value is equal to zero and if the first weighting factor is not equal to zero and if the sum of the first and the second weighting factor is not zero.

If it is further decided that jumps are treated as a sequence of threshold crossing or if one knows that the signal to be analysed cannot jump or if it is ok to have wrong detections if jumps do occur, one may also drop the requirement that the first and the second weighting value are not equal. Essentially, one loses the ability to distinguish between the sequences i) and iii) but the method becomes even easier and faster. This is the embodiment including all of the preferred option mentioned above.

In one embodiment the method with the first and the second threshold being positive and the first threshold being greater than the second threshold and the first direction being negative is used with a DC-voltage as signal and/or the method comprises the rectification of the sensed voltage as first step of the method and uses this rectified voltage as signal.

In many applications one wants to estimate the properties of a DC-voltage which changes periodically with time or of a rectified AC-voltage. The method can be used with both types of voltages and can even be applied if the voltage does not come close to zero at all, as the second threshold may be set at any voltage value.

However the method is also useful for normal AC-voltage with changing sign.

Further, it is also possible to choose the first threshold to be smaller than the second threshold and/or to choose the first direction being positive.

In one embodiment the first threshold is positive and greater than a third threshold, which is positive, too. The second threshold is negative and smaller than a fourth threshold, which is negative, too. The first direction is negative and the second direction is positive. The second weighting value and/or the second mathematical operation g(WF2,*) is chosen such that applying the second mathematical operation g(WF2,*) on the second weighting value and the result of applying the first mathematical operation f(WF1,*) on the first weighting value and a test value x does not yield the test value x: $x \neq g(WF2, f(WF1, x))$ Preferably, the first and the second mathematical operations are additions and the first weighting value is not equal to the second weighting value multiplied with (−1).

The comparison value is equal to the first mathematical operation applied to the first weighting value and the starting value and the trigger-condition is the equality of the value of the tracker variable and the comparison value.

Preferably, the method comprises further the steps of locking the tracker variable when the signal crosses the third threshold in the first direction and when the signal crosses the fourth threshold in the second direction. A locked tracker variable cannot be modified unless it is unlocked again. Preferably, the tracker variable is unlocked such that it can be modified again, when the signal crosses the third threshold in the second direction or the fourth threshold in the first direction.

The four thresholds can be arranged symmetrically around a signal value of 0, e.g. around 0 Volt if the signal is a voltage. The first and the second threshold are the outermost thresholds. A "point of time" is detected at the first negative crossing of the second threshold after a negative crossing of the first threshold. As the second threshold is at a negative signal value and the first threshold is at the positive signal value, this embodiment is suitable only for signals with alternating signs.

The condition on the first and second weighting values in combination with the first and second mathematical operation ensures that every crossing of the second threshold leads to a different value of the tracker variable. Therefore the first crossing can be distinguished from all of the following crossings of the second threshold until the tracker variable is set to its starting value again.

The third and the fourth threshold lock and unlock the tracker variable when crossed. A locked tracker variable cannot be changed until it is unlocked. The situation that a threshold is crossed which would change the tracker variable value, but this does not happen because of a locked tracker variable can happen if jumps are occurring and if these jumps are not treated like a sequence of threshold crossings. In the given embodiment, the third and the fourth threshold are both close to zero signal value. A jump in the signal from some higher absolute signal value to a signal value between the third and fourth threshold and/or back may happen for example if a black-out or a brown-out happens and ends again.

Detecting a crossing of the first or second threshold with a locked tracker variable may be used as an indicator for the occurrence of a fast drop of the signal.

In one embodiment, an event record is created. The event record comprises a list of all detected points of time $E_i$. These points of time are detected by one of the methods described above and they are stored in an event record:

Event record=$(E_0, E_1, \ldots, E_X)$

Preferably a point of time $E_y$ is deleted from the event record or is not saved in the event record if the distance $D_y$ between this point of time $E_y$ and the previous point of time $E_{y-1}$ is below a minimum distance, $D_{min}$, i.e. $D_y < D_{min}$.

Preferably, new points of time $E_{N0}, E_{N1}, \ldots, E_{NJ}$, are written in the event record, such that there are no subsequent points of time in the event record which are separated by more than a maximum distance $D_{max}$, i.e. $\forall\ D_i \le D_{max}$. Subsequent points of time are pairs of points of time with no point of time occurring at a time between them.

Storing all the points of time allows analysing their distribution over time. The distribution of the points of time over time may be analysed and/or filtered to improve the parameter choice used in the method, to estimate the harmonic content of the signal or to determine reliable points of time or to estimate signal properties.

The length of the event record can be fixed or it can grow with increasing number of detected points of time. The event record may be a list of all times at which a point of time was detected. However it may also be a list of data-tuples including for example one or more of the following information: the time of occurrence of a point of time, the order in which the points of time have occurred, the distance in time to the following or previous point of time, the integral of some function depending of the signal between the point of time and the following or previous point of time, etc.

The event record can be a sorted or an unsorted list. A sorted list, in which the points of time are listed in order of their occurrence is preferred. However, as the event record comprises the times at which every one of the points of time occurred an unsorted list can be sorted as soon as it is needed.

Making sure, that all points of time are distributed such that distances are in a range between a given minimum distance $D_{min}$ and a given maximum distance $D_{max}$ allows to filter obviously wrong results and may be an advantage from a computational point of view as overflow problems are avoided if the event record is used to calculated differences between points of time.

The maximum distance $D_{max}$ is the upper limit period and its reciprocal is the lower limit frequency assumed for the embodiment of the method at hand.

The minimum distance $D_{min}$ is the lower limit period and its reciprocal is the upper limit frequency assumed for the embodiment of the method at hand.

In one embodiment a distances record is created. This comprises the steps of
  a) Collecting points of time either by applying the method for estimating a property of a signal or by reading an event record
  b) Preferably, sorting the points of time by ascending time of occurrence and numbering the points of time is this order, thereby assigning each point of time a number;
  c) determining the distances $D_i$ between every two subsequent points of time $E_i$, $E_{i-1}$ by subtracting the earlier point of time from the later point of time,
  d) preferably, assigning each distance $D_i$ a number equal to the number of the later point of time,
  e) storing the distances $D_i$ in a distances record,
    a. which is ordered and the distances are stored in the order of the occurrence of the earlier or the later of the two points of time between which the respective distance was evaluated
    or
    b. which comprises data-tuples and each data-tuple comprises one of the distances and the number of occurrence of the earlier or the later of the two points of time between which the respective distance was evaluated
    or
    c. which is ordered and the distances are stored in the order of their number or
    d. which comprises data-tuples and each data-tuple comprises one of the distances and the number of this distance, Distances record=$[D_1, D_2, \ldots, D_X]$ or Distances record=$([D_1, Nr(D_1), \ldots], [D_2, Nr(D_2), \ldots], \ldots, [D_X, Nr(D_X), \ldots])$ f) preferably deleting or not saving distances smaller than a minimum distance $D_{min}$ from or in the distances record and, if appropriate, adapting the numbers of the remaining distances accordingly in the distances record,
  g) preferably, splitting distances larger than a maximum distance $D_{max}$ up in one or more distances of a length $D_{max}$ and a remainder and inserting theses distances in the distances record and, if appropriate, adapting the numbers of the distances accordingly in the distances record.

The distances record is similar to the event record. However, in contrast to the event record, the time of occurrence of the points of time is not automatically included in the list. Therefore the order of occurrence needs to be saved somehow: One method is to use a sorted list in which the order of the entries indicates the order of occurrence. Another method is to save data-tuples which include a number which indicated the order of occurrence.

In one embodiment, the distances record is written in real time while collecting points of time during a signal measurement: A time counter is started when a point of time was detected and stopped at the time of the detection of the following point of time. The value of the time counter indicates the distance between the two points of time. The value of the time counter is written in the distances record as a new entry, either in front of or behind all existing entries. The distances record is a sorted record.

If the time of detection of a point of time and the time of occurrence of this point of time are not in a distance in time which is over the whole measurement constant, the time of occurrence of a point of time is preferably used instead of the time of detection to determine distances and the order of occurrence.

Saving the distances instead of the points of time itself reduces the computational burden needed later to evaluate the data, as for many applications only the distances between the points of time in their order of occurrence are of interest.

The distances record can be a list which grows with increasing number of points of time or the distances record can have a fixed length. If the distances record has a fixed length, preferably the oldest entry is deleted when a new entry is saved. If the distances record is a sorted list, the list entries are shifted by one if the oldest entry is deleted such that the oldest entry is always at the same place in the list. Instead of deleting the oldest entry it can simply be overwritten by the next-oldest entry during this shifting step.

Making sure, that all distances are in a range between a given minimum distance $D_{min}$ and a given maximum distance $D_{max}$ allows to handle obviously wrong results and may be an advantage from a computational point of view as overflow problems are avoided.

The method for determining a sliding and weighted half period of a point of time $E_X$, comprises the steps of:
  a) detecting points of time $E_0, \ldots E_X$, with a method for estimating a property of a signal or by reading an event record b) setting the value of the sliding and weighted half period at a point of time $E_X$ (SWHP($E_X$)) to the maximum value of a list containing
   a. the minimum distance, $D_{min}$ and
   b. a fixed quantity A of distances $D_i$ divided by a divider Div. The distances $D_i$ occur earlier or coincidental with the point of time $E_X$. The distances are preferably smaller than the maximum distance $D_{max}$. The distance $D_i$ is the distance between two subsequent points in time $E_{i-1}$ and $E_i$. This distance $D_i$ is associated with the time of its end point of time $E_i$. The end point of time $E_i$ is the later one of the two subsequent points of time $E_{i-1}$ and $E_i$ used to calculate the distance $D_i$. This associated time of the distance $D_i$ should preferably be understood as the time of occurrence of this distance $D_i$.

$$D_i = \text{distance between } E_{i-1} \text{ and } E_i = E_i - E_{i-1}$$

$$SWHP(E_X) = \max\left(\frac{D_{X-A}}{Div}, \frac{D_{X-A+1}}{Div}, \ldots, \frac{D_X}{Div}, D_{min}\right)$$

The sliding and weighted half-period is an estimate for a half-period of the signal if the signal is rectified. If the signal is not rectified, it is an estimate for the period of the signal.

The SWHP considers the last A distances between two subsequent points of time. Preferably, it considers the last A distances between two subsequent points of time which are smaller than the maximum distance $D_{max}$.

The fixed quantity A is a parameter with which the "inertia" of the SWHP can be regulated: Assume that for some reason an unusual large distance between two subsequent points of time appears: This unusual large distance will determine the SWHP value until A new points of time are detected. If the fixed quantity A is large, this will take some time. On the other hand, there may be "clusters" which are of points of time close to each other which belong all to the same fundamental period region. Imagine for example a harmonic with an amplitude greater than the distance between the first and the second threshold added to a fundamental: In the time needed for the fundamental to cross the first and the second threshold, the harmonic has crossed both thresholds multiple times. The result are clusters of detected points of time at each crossing of the two thresholds by the fundamental. In order to estimate the period of the fundamental, the distance between two clusters is a better estimate than the distances between most of the points of time. This distance between two clusters, measured from the last point of time of the one cluster to the first point of the time of the following cluster, can be used in the SWHP. In order to archive this goal, the fixed quantity A should be larger than the number of points of time in every cluster. A typical value for A can be between 8 and 16. However, a choice for the value of the fixed quantity A is best made based on reasonable assumptions about the signal and based on the requirements of the electrical system which should be influences by the estimated signal properties.

The divider Div is the second free parameter: The divider Div is preferably greater than 1. In this case the SWHP is smaller than the largest of the last A distances. This property is desired, if the SWHP is later used for determining "reliable points of time". However, if the SWHP should be used as an estimate for length of a half-period or a period as a signal property or if the SWHP is used it to calculate an estimate for another signal property, a divider Div of 1 or less may be better: As explained above, if clusters of points of time occur, SWHP is based on the distance between the last point of time of the one cluster and the first point of time of the next cluster.

However, in most cases the distance between two subsequent first or two subsequent last points of time is probably the better estimate for the half-period or the period of the fundamental. The SWHP is therefore in "cluster"-cases based on numbers which are too small. Using a divider Div of less than 1 can reduce this issue. A typical value for the divider Div is between 0.95 and 1.2. However, a choice for the value of the divider Div is best made based on reasonable assumptions about the signal and based on what the SWHP should be used for.

The method for determining a sliding and weighted half period of a distance $D_X$ comprises the steps of:
a) Determining distances $D_0, \ldots D_X$,
   a. by reading the distances record
      or
   b. by collecting points of time either by applying the method for estimating a signal property or by reading an event record; Determining the distances $D_i$ between every two subsequent points of time $E_i$, $E_{i-1}$ by subtracting the earlier point of time from the later point of time; A distance occurs at the later one of the two points of time it is calculated from.
b) setting the value of the sliding and weighted half period at distance $D_X$ (SWHP($D_X$)) to the maximum value of a list containing
   a. a fixed quantity A of distances $D_i$ divided by a divider Div. The distances $D_i$ have a number smaller or equal to the number of $D_X$. Or the distances $D_i$ are in a sorted distances record in time before or at the same record as the distance $D_X$. Or the distances $D_i$ occur before or at the distance $D_X$. The distances $D_i$ are preferably smaller than the maximum distance $D_{max}$.
   b. and the minimum distance, $D_{min}$.

$$SWHP(D_X) = \max\left(\frac{D_{X-A}}{Div}, \frac{D_{X-A+1}}{Div}, \ldots, \frac{D_X}{Div}, D_{min}\right)$$

c) preferably saving the sliding and weighted half period of every distance $D_i$ SWHP($D_i$), as an entry in the data-tuple containing information about the distance $D_i$ in the distances record:

Distances record=([$D_1$,SWHP($D_1$), . . . ],[$D_2$,SWHP ($D_2$), . . . ], . . . ,[$D_X$,SWHP($D_3$) . . . ])

The method for determining a sliding and weighted half period of a distance $D_X$ is similar to the method for determining a sliding and weighted half period of a point of time $E_X$.

However, there is no need to know the times of occurrence of the points of time if the distances are known. Preferably, one uses the method for determining a sliding and weighted half period of a point of time $E_X$ if the points of time are available and the method for determining a sliding and weighted half period of a distance $D_X$ if the distances are available.

The remarks above about the fixed quantity A and the divider Div apply to both methods to determine a sliding and weighted half period. Also the sliding and weighted half period can be interpreted in the same way.

The method for determining if a point of time is reliable comprises the following steps:
  a) detecting points of time $E_0, \ldots E_X$, with a method for estimating a property of a signal or by reading an event record,
  b) determining the distance Y between a first point of time $E_{X+1}$ and a second point of time $E_i$ which is reliable and which is the latest reliable point of time before the first point of time $E_{X+1}$,
  c) defining the first point of time $E_{X+1}$ as being reliable if
    a. the distance Y is larger or equal to the sliding and weighted half period at the first point of time $E_{X+1}$, (SWHP($E_{X+1}$)),
    or
    b. preferably if the distance Y is larger than the maximum distance $D_{max}$.

Y=distance between $E_i$ and $E_{X+1}$=$E_{X+1}-E_i$ $E_{X+1}$ is reliable if $Y \geq \min(SWHP(E_{X+1}), D_{max})$ A "reliable point of time" and a "point of time which is reliable" are the same in the context of this invention. The distance between two reliable points of time is an improved estimate for the period or the half-period of the fundamental of the measured signal.

A first reliable point of time can be set at the beginning of the measurement or at the first detected point of time. In the following, the distance between the latest reliable point of time and every newly detected point of time is measured. This is the distance Y.

One way of determining Y is to start a time counter at the reliable point of time and read its value every time a point of time is detected. Another way is to save the time of the reliable point of time and to subtract this value from the later times at which points of time occur.

The distance Y between the last reliable point of time and an examined point of time is compared to the SWHP of the examined point of time. If the distance to the last reliable point of time Y is larger than the SWHP, the examined point of time is reliable, too. For the examination of the following points of time, this newly detected reliable point of time is the reliable point of time from where the distance Y is measured.

The SWHP is roughly speaking a measure for the largest distance between two subsequent points of time. In other words, points of time are reliable if they have a distance from each other which is greater than or equal to the largest observed distance two subsequent points of time have from each other.

To illustrate the idea one might think at the "cluster"-case discussed above: There are many points of time close to each other in the first cluster, followed by a time interval without any points of time, followed by the second cluster. The SWHP will be approximately the distance between the last point of time of the first cluster and the first point of time of the second cluster. Assume further, that the first point in the first cluster is a reliable point of time. If the cluster is concentrated such that the distance between the first point in the first cluster and the last point in the first cluster is shorter than the SWHP, there will be no further reliable point in the first cluster. However, the first point of time of the second cluster has from the last reliable point of time a distance of approximately the SWHP plus the length of the first cluster which is clearly more than the SWHP. Therefore the first point of the second cluster is reliable, too.

In the SWHP, there is the divider Div: If this divider Div is large, the SWHP becomes small and the risk increases that a cluster has a comparable or greater length than the SWHP which would lead to multiple reliable points of time inside a single cluster. On the other hand, if there are no clusters and the divider Div is set to a value vary close to 1 or smaller, most likely only every second point of time is detected as being a reliable point of time although in this case all points of time should have been detected as being reliable.

Finally, it may be advantageous to limit the maximum distance between two reliable points of time to the maximum distance $D_{max}$: This can improve the computational stability as no overflow can happen and the occurrence of reliable points of time which are not points of time at the same time can be used as indicator for potential problems.

The information, if a point of time is or is not reliable, can be saved in the event record. It can also be saved in a separate record. However it does not need to be saved: To estimate many signal properties one can simply integrate a function of the signal over the time between two reliable points of time. Therefore starting and stopping counters for time and signal depending functions at the reliable points of time is in some cases sufficient.

Using reliable points of time or reliable distances and limiting their distance to the maximum distance $D_{max}$ allows also to estimate the signal properties, if a signal is constant in time. In this case, the signal properties will be determined over distances of the length $D_{max}$. By comparing the findings of points of times and reliable points of time and seeing that there are essentially only reliable points of time and no "normal" points of time, one can assume that the signal is approximately constant. The precision of this assumption is determined by the choice of the thresholds.

The method for determining if a distance is reliable comprises the following steps:
  a) Determining distances $D_0, \ldots D_X$,
    a. by reading the distances record
    or
    b. by collecting points of time either by applying the method for estimating a signal property or by reading an event record; Determining the distances $D_i$ between every two subsequent points of time $E_i, E_{i-1}$ by subtracting the earlier point of time from the later point of time; A distance occurs at the later one of the two points of times it is calculated from.
  b) determining the distance Y between a first distance $D_{X+1}$ with the number $Nr(D_{X+1})$ and a second distance $D_{Fi}$ with the number $Nr(D_{Fi})$. The second distance $D_{Fi}$ is a reliable distance. The second distance $D_{Fi}$ has the largest number of all reliable distances which is smaller than the number of the first distance $D_{X+1}$ $Nr(D_{X+1})$. The distance Y between the first and the second distance is determined by addition of all distances with numbers between $Nr(D_{Fi})+1$ and $Nr(D_{X+1})$.
  c) defining the first distance $D_{X+1}$ to be reliable if
    a. the distance Y is larger or equal the sliding and weighted half period at the first distance $D_{X+1}$, (SWHP($D_{X+1}$)),
    or
    b. preferably if the distance Y is larger than the maximum distance $D_{max}$.

Y=distance between $D_{Fi}$ and $D_{X+1}$=$\sum_{j=Nr(D_{Fi})+1}^{Nr(D_{X+1})} D_k$, with $Nr(D_k)=j$ $\exists D_{X+1}$ is reliable if $Y \geq \min(SWHP(D_{X+1}), D_{max})$ d) preferably saving the information that the first distance $D_{X+1}$ is or is not reliable as an entry in the data-tuple containing information about the distance $D_{X+1}$ in the distances record:

Distances record =
$$\left( \begin{array}{c} [D_1, \ldots, D_1 \text{ reliable?}, \ldots], [D_2, \ldots, D_2 \text{ reliable?}, \ldots], \ldots, \\ [D_X, \ldots, D_X \text{ reliable?}, \ldots] \end{array} \right)$$

Instead of the number of a distance, the position of a distance in the distances record which is a sorted list can be used, too. Instead of the number of a distance, its time of occurrence can be used, too.

The method for determining if a distance $D_X$ is reliable is similar to as the method for determining if a point of time $E_X$ is reliable.

However, there is no need to know the times of the points of time if the distances are known. Preferably, one uses the method for determining if a point of time $E_X$ is reliable if the points of time are saved or otherwise known and the method for determining if a distance $D_X$ is reliable if the distances are saved or otherwise known.

In one embodiment of the method for estimating a property of a signal x(t), the signal property to be estimated is the effective signal $X_{eff}$.

It can be estimated by integrating the square of the sensed signal between two points of time ($E_m, E_n$) and by dividing this integrated signal through the distance between the same two points of time $D_{mn} = E_n - E_m$.

Preferably, the two points of time are subsequent points of time or the two points of time are two reliable points of time. Preferably, the two points of time are two reliable points of time without any other reliable points of time in between them.

$$X_{eff}(E_m, E_n) = \sqrt{\frac{1}{E_n - E_m} \int_{E_m}^{E_n} x(t)^2 dt}$$

The effective signal can also be estimated by integrating the square of the sensed signal between the later one of the two points of time used to evaluate a first distance $D_m$ and the later one of the two points of time used to evaluate a second distance $D_n$ and by dividing this integrated signal through the distance between the same two distances.

Preferably, the distance between the first and the second distance is evaluated by addition of all distances with numbers between and including the number of the first distance $D_m$ plus one and the number of the second distance $D_n$: $D_{mn} = \sum_{j=m+1}^{n} D_k$ with $j = Nr(D_k)$.

The two distances are preferably two distances with subsequent numbers $Nr(D_m) + 1 = Nr(D_n)$ or two distances which are reliable.

Preferably, the two distances are two reliable distances with numbers such that there is no reliable distance with a number in between.

$$X_{eff}(E_m, E_n) = \sqrt{\frac{1}{D_{mn}} \int_{E_m}^{E_n} x(t)^2 dt}$$

Instead of the number of a distance, the position of a distance in the distances record which is a sorted list can be used, too. Instead of the number of a distance, its time of occurrence can be used, too.

For a signal being a voltage signal, the effective signal is the effective voltage which is an important parameter of a voltage with changing amplitude. The method assumes that two points of time are in most cases separated by one half-period or one period of the fundamental frequency. Therefore the integral over this distance is an estimate for the integral over one half-period for rectified voltages or one period for unrectified voltages. This integral occurs in the theoretical formula for calculating the effective voltage.

As explained above, the use of reliable points of time may improve the estimate.

In a method for determining an improved effective signal $X_{eff,imp}$ a floating average of an even number of subsequent effective signal values $X_{eff}(E_{m0}, E_{n0})$, $X_{eff}(E_{m1}, E_{n1})$, ..., $X_{eff}(E_{mx}, E_{nx})$ as estimated according to one of the methods given above is calculated. This calculation is done by adding the subsequent effective signal values and dividing this sum by the number of added effective signal values. There is a first relationship between the two points in time ($E_{mi}, E_{ni}$), between which each one of the involved subsequent effective signals is determined and this first relationship is the same for all involved subsequent effective signal values. All of the points of time ($E_{m0}, E_{m1}, \ldots, E_{mx}$) which are the earlier ones of the two points in time, between which one of the involved subsequent effective signals is determined, are in a second relationship towards each other. Preferably, the even number is two ($X_{eff}(E_{m0}, E_{n0})$, $X_{eff}(E_{m1}, E_{n1})$) and the first relationship is that the two points in time are two reliable points in time with no other reliable point in time between them. ($E_{mi}$ is reliable, $E_{ni}$ is reliable, no reliable point between $E_{mi}$ and $E_{ni}$)

Preferably, the second relationship is that all earlier points of time are reliable points in time with no other reliable point in time between them:

$$X_{eff,imp} = \frac{1}{2}(X_{eff}(E_m, E_n) + X_{eff}(E_n, E_p))$$

With $E_m$, $E_n$, $E_p$ being reliable points of time and there are no further reliable points of time in between them.

The first relationship between two points of time defines the interval over which every one of the effective signal values is calculated. Choosing two subsequent points of time or two subsequent reliable points of time reduces the measurement time needed to determine every single one of the effective signal values. Choosing two points of time or two reliable points of time with one or more points of time or reliable points of time in between them makes the estimate however less dependent on the assumption that the distance between the two points of time or the two reliable points of time is close to the period of the fundamental.

The second relationship determines which ones of the possible effective signals are averaged: The effective signals may "overlap" or not and the amount of "overlap" or the distance between them is what the second relationship determines. An overlap of two effective signals is the number of points of time or reliable points of time which appear in the calculation of both effective signals. A distance between two effective signals should be the number of points of time or reliable points of time which are on a time line between the points of time or reliable points of time appearing in the calculation of the one effective signal and the points of time or reliable points of time appearing in the calculation of the other effective signal. A large overlap leads to a smoother change of the improved effective signal with time while a small or non-existing overlap is less influenced by single effective signal values which differ strongly from all others. Such strongly differing values are often due to measurement or numerical problems and often it is desirable to ignore them as much as possible.

Averaging over an even number of effective signal values is, in most cases, averaging over an integer number of periods of the fundamental, even if the signal is rectified before being analysed. It was observed that there is sometimes a small difference between the estimated length of the first half-period and the estimated length of the second half-period of a fundamental if this estimate is based on the distance between two points of time or two reliable points of time and if the signal is rectified. By averaging over an integer number of periods of the fundamental, this small difference in the estimated length does not influence the improved effective signal.

However, especially in cases where a non-rectified signal is observed, averages over uneven numbers of effective signal values are also possible.

In one embodiment of the method for estimating a property of a signal x(t) the signal property to be estimated is the mean signal $X_m$ or the absolute mean signal $X_{m,abs}$.

It can be estimated by integrating, in the case of the mean signal $X_m$, the sensed signal or in the case of the absolute mean signal $X_{m,abs}$ the absolute value of the sensed signal, between two points of time $(E_m, E_n)$ and by dividing this integrated signal through the distance between the same two points of time $D_{mn} = E_n - E_m$.

Preferably the two points of time are subsequent points of time or the two points of time are two reliable points of time. Preferably, the two points of time are two reliable points of time between without any other reliable point of time between them.

$$X_m(E_m, E_n) = \frac{1}{E_n - E_m} \int_{E_m}^{E_n} x(t) dt$$

$$X_{m,abs}(E_m, E_n) = \frac{1}{E_n - E_m} \int_{E_m}^{E_n} |x(t)| dt$$

The mean signal $X_m$ or the absolute mean signal $X_{m,abs}$ can also be estimated by integrating, in the case of the mean signal $X_m$, the sensed signal or in the case of the absolute mean signal $X_{m,abs}$ the absolute value of the sensed signal. The integrals run between the later one of the two points of time used to evaluate a first distance $D_m$ and the later one of the two points of time used to evaluate a second distance $D_n$. This integrated signal is divided through the distance between the first and the second distances. Preferably, the distance between the first and the second distance is evaluated by addition of all distances with numbers between and including the number of the first distance $D_m$ plus one and the number of the second distance $D_n$: $D_{mn} = \sum_{j=m+1}^{n} D_k$ with $j = Nr(D_k)$ The two distances are preferably two distances with subsequent numbers $Nr(D_m)+1 = Nr(D_n)$ or two distances which are reliable. Preferably, the two distances are two reliable distances with numbers such that there is no other reliable distance with a number in between.

$$X_m(E_m, E_n) = \frac{1}{D_{mn}} \int_{E_m}^{E_n} x(t) dt$$

$$X_{m,abs}(E_m, E_n) = \frac{1}{D_{mn}} \int_{E_m}^{E_n} |x(t)| dt$$

Instead of the number of a distance, the position of a distance in the distances record which is a sorted list can be used, too. Instead of the number of a distance, its time of occurrence can be used, too. The distance between the first and the second distance can in these case be calculating by the addition of a distances in the distances record between, but not including the first distance and the second distance whereby the second distance is included in the sum or the difference between the time of the occurrence of the first distance to the time of occurrence of the second distance.

The mean or the absolute mean signal are two parameters of interest of a signal. The method assumes that two points of time are in most cases separated by one half-period or one period of the fundamental frequency. Therefore the integral over this distance is an estimate for the integral over one half-period for rectified signals or one period for unrectified signals which occurs in the theoretical formula for calculating the mean respectively the absolute mean signal.

As explained above, the use of reliable points of time may improve the result even further.

The method for determining an improved mean signal $X_{m, imp}$ or an improved absolute mean signal $X_{m, abs, imp}$ is the same as the method for determining an improved effective signal with the only exception that mean signal values or absolute mean signal values are used instead of effective signal values.

In one embodiment of the method for estimating a property of a signal x(t), the signal property to be estimated is the peak signal $X_{max}$, which is estimated to be a largest signal value sensed between two points of time.

Preferably the two points of time are subsequent points of time or the two points of time are two reliable points of time.

Preferably, the two points of time are two reliable points of time without any other reliable point of time in between them.

One way to estimate the peak signal is to start a variable at the time of a first point of time and compare the value of this variable with the momentary signal measurement at each sample of the signal: If the signal is higher than the value of the variable, the signal value is the new value of the variable, otherwise the variable keeps its value. The value of the variable at the time of the second point of time is the estimate for the peak signal.

Another way to estimate the peak signal is to save all signal measurements which happen between the two points of time and to determine the maximum value of all measurements afterwards.

Assuming that the distance between the two points of time or the two reliable points of time is approximately equal to the period or the half-period of the fundamental, a reasonable estimate of the peak signal which occurs at least once per period should be found. If a rectified signal is observed, analysing the signal between two points of time which have another point of time in between them may improve the result as the first and the second half-period do not need to have the same peak signal value. The same can be done with reliable points of time.

In one embodiment of the method for estimating a property of a signal x(t), the signal property to be estimated is the fundamental frequency $f_0$.

It can be estimated to be proportional to a proportionality constant of one over the distance between two subsequent points of time $(E_{X-1}, E_X)$ or two reliable points of time which have no reliable point of time between them ($E_a$ is reliable, $E_b$ is reliable). Preferably, this proportionality constant is multiplied by one, if the signal x(t) is not rectified and multiplied by 0.5, if the signal x(t) is rectified.

$$f_0 \propto \frac{1}{(E_X - E_{X-1})} \text{ or } f_0 \propto \frac{1}{(E_b - E_a)}$$

The fundamental frequency can also be estimated to be proportional to a proportionality constant of one over the distance $D_X$. The fundamental frequency can also be estimated to be proportional to a proportionality constant of one over the sum of all distances with numbers between the number of a first distance $D_a$ and the number of a second distance $D_b$, including the second distance $D_b$. Thereby, the first and the second distance $D_a$, $D_b$ are reliable and there is no reliable distance with a number between the number of the first and the second reliable distance. Preferably, this proportionality constant is multiplied by one, if the signal $x(t)$ is not rectified and multiplied by 0.5, if the signal $x(t)$ is rectified.

$$f_0 \propto \frac{1}{D_X} \text{ or } f_0 \propto \frac{1}{\sum_{j=Nr(D_a)+1}^{Nr(D_b)} D_k} \text{ with } j = Nr(D_k)$$

Instead of the number of a distance, the position of a distance in the distances record which is a sorted list can be used, too. Instead of the number of a distance, its time of occurrence can be used, too.

It is here assumed that the distance between two subsequent points of time or two subsequent reliable points of time is an estimate for the period of the fundamental in the case of a non-rectified signal or an estimate for the half-period of the fundamental in the case of a rectified signal.

In a method to determine an improved fundamental frequency $f_{0,imp}$, a floating average of an even number of subsequent fundamental frequency values is calculated. This is done by the addition of the subsequent fundamental frequency values and division by the number of added subsequent frequency values. The even number of subsequent fundamental frequencies is preferably two. Subsequent fundamental frequency values are fundamental frequency values estimated at subsequent points of time or at distances with subsequent numbers or at distances with subsequent places in the distances record.

The method is similar to the method for determining an improved effective signal.

In one embodiment of the method for estimating a property of a signal $x(t)$, the signal property to be estimated is a characteristic number for the amount of harmonic content H.

This characteristic number can be evaluated by using the number and/or the distribution of points of time and/or reliable points of time.

Preferably, the characteristic number for the amount of harmonic content H is the number of points of time between two reliable points of time with no other reliable point in time between them.

The characteristic number can also be evaluated by using the number and/or the differences of distances and/or reliable distances.

Preferably, the characteristic number for the amount of harmonic content H is the number of distances between two reliable distances, $D_b$ and $D_a$ with no further reliable distance with a number between the numbers of these two reliable distances $D_b$, $D_a$ Instead of the number of a distance, the position of a distance in the distances record which is a sorted list can be used, too. Instead of the number of a distance, its time of occurrence can be used, too.

The basic idea of the preferred embodiment is to distinguish and characterize a situation with clusters of points of time from a situation without clusters, where most points of time are also reliable points of time. Instead of simply counting the points of time between two subsequent reliable points of time one might measure the "length" of a cluster, i.e. the distance between the first and the last point of time of a cluster and compare this to the distance between two subsequent reliable points of time.

In one embodiment, the signal $x(t)$ is a voltage signal $u(t)$ or a current signal $i(t)$ or a power signal $w(t)$.

For many parts of electrical systems, it is of great importance for a reliable functioning that voltages and/or currents behave in a certain way and are e.g. not greater or smaller than known limits. Further, devices for sensing voltages and/or currents are very well known, and reliable. Therefore there is in many cases a need to know properties of voltage or current signal and there are the devices to sense these signals. Sometimes, components the power or the energy present somewhere in an electrical system may be the signal one wants to know the characteristics of.

Depending on the application at hand, there can be also an interest on the properties of other signals: e.g. charges or magnetic fields of an electrical system may change with time and need to be observed. In this case a suitable sensor can sense the signal of interest and the method for estimating a property of a signal can be applied to a signal indicating a charge or a magnetic field.

An electronic device comprises a micro controller and/or an analogue circuitry. The micro controller and/or the analogue circuitry performs a method for estimating a property of a signal sensed in this electronic device. Preferably, the micro controller and/or the analogue circuitry controls other parts of the electronic device depending on the obtained results.

In one embodiment, the electronic device is a switched mode power supply.

Such an electronic device can protect or adapt itself to changes in the supply voltage, the supply current, the supply power or in other voltages, currents or powers. As the method for estimating a property of a signal does not require much computational power, the additional hardware needed is cheap and robust. The method is further fast enough to allow a sufficient protection in most cases. If a critical signal property is detected, at least parts of the electronic device can be switched of or internal switching frequencies can be adapted. Switches may open or close for connections to back-up voltage, current or power sources or to recharge such back-up solutions. These are just a few examples of possible reactions on estimates of signal properties. Depending on the application and the requirements of the hardware, many further actions can be started or stopped depending on the estimates.

Other advantageous embodiments and combinations of features come out from the detailed description below and the totality of the claims.

BRIEF DESCRIPTION OF THE DRAWINGS

The drawings used to explain the embodiments show.

PREFERRED EMBODIMENTS

All figures illustrate the method for estimating a property of a signal on the example of a voltage signal. Instead of the voltage signal, also another signal as e.g. a current signal, a power signal, an energy signal, a charge signal, a magnetic field signal or any other signal which can be sensed in an electrical system can use the method and the device illustrated in the following. Signals which cannot have negative values, like e.g. a power or an energy signal, can replace a rectified voltage signal in the following examples. Signals which can have positive and negative values, like e.g. a current signal, can replace a voltage signal in the following examples. In both cases, the threshold values need to be replaced by values of the same unit at the signal: For example thresholds could be at 0.05, 0.1 and 0.2 Amperes instead of 50, 100 and 200 V in the case of a current signal or at 0.5, 1 and 2 Watt in the case of a power signal.

Figure 1:
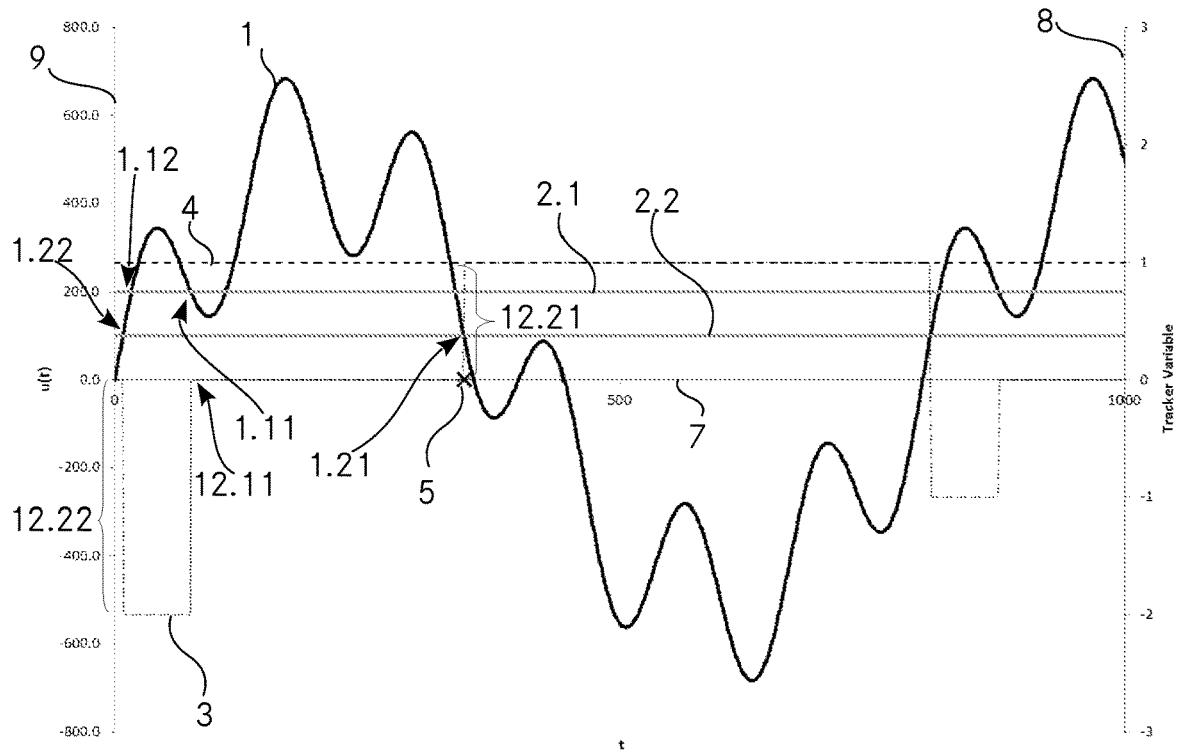
FIG. 1 A first embodiment with two thresholds and an alternating voltage as signal FIG. 2 A second embodiment with two thresholds and a rectified voltage as signal FIG. 3a A third embodiment with three thresholds and a rectified voltage as signal showing how reliable points of time are detected FIG. 3b The same situation as shown in FIG. 3a but instead of the tracker variable, the distances to the points of time and the reliable points of time are shown FIG. 4 The third embodiment with three thresholds and a rectified voltage as signal showing the integral of the voltage between two reliable points of time FIG. 5a A fourth embodiment with 4 thresholds and an alternating voltage as signal, showing the effect of a short black out on the detection of points of time and reliable points of time when the tracker variable is never blocked FIG. 5b The same situation as shown in FIG. 5 but with a tracker variable which can be blocked FIG. 6 A power supply which uses the method for estimating a signal property to protect itself from critical input voltages whereby the signal is an input voltage In the figures, the same components are given the same reference symbols.

FIG. 1 illustrates a first embodiment of a method for estimating a property of a voltage u(t). The waveform of the voltage 1 is in this case a sinusoidal curve with a fundamental frequency and added onto this curve is the 6th harmonic with an amplitude of 40% of the amplitude of the fundamental. The waveform 1 is plotted in a diagram where the left y-axis 9 shows the voltage, the right y-axis 8 the tracker variable 3 and the x-axis 7 the time. In addition to the waveform of the voltage 1 there are two thresholds 2.1 and 2.2 depicted. The first threshold 2.1 is at a positive voltage value which is larger than the one of the second threshold 2.2. The voltage value of the second threshold 2.2 is positive, too. The voltage waveform 1 crosses both thresholds 2.1 and 2.2 multiple times and in both, positive and negative directions. A crossing in a positive direction is a situation where the waveform 1 increases in the nearest neighbourhood around the crossed threshold, seen in the direction of the positive x-axis 7, i.e. time. A crossing in a negative direction is a situation where the waveform 1 decreases in the nearest neighbourhood around the crossed threshold, seen in the direction of the positive x-axis 7, i.e. time. There is a positive crossing of the first threshold 1.12, a positive crossing of the second threshold 1.22, a negative crossing of the first threshold 1.11 and a negative crossing of the second threshold 1.21.

The positive crossing of the first threshold 1.12 causes a tacker variable 3 to be locked. This means that the tracker variable 3 cannot change its value until it is unlocked. A negative crossing of the first threshold 1.11 unlocks the tracker variable 3 and sets it to the value zero. A positive crossing of the second threshold 1.22 subtracts the value "two" from the value of the tracker variable 3 and a negative crossing of the second threshold 1.21 adds the value "one" to the tracker variable 3.

The first threshold 2.1 is a first threshold in the sense of the invention. The second threshold 2.2 is a second threshold in the sense of the invention. The first direction is negative in this embodiment. The first mathematical operation is an addition of the first weighting value 6.21 which is "one" in this embodiment. The second mathematical operation can be either a subtraction of a second weighting value 6.22 being "two" or an addition of a second weighting value 6.22 of "minus two".

In FIG. 1, the value of the tracker variable 3 is plotted, too. The left y-axis 8 is the relevant axis for the tracker variable 3. Going from left to right, the voltage waveform 1 starts at a voltage value of 0. It increases and crosses the second threshold in positive direction 1.22. Thereby the tracker variable gets the value of −2. Shortly afterwards, the voltage waveform crosses the second threshold in a positive direction 1.12. This causes the tracker variable 3 to be locked, which is not visible in FIG. 1. A short time later, the voltage waveform 1 crosses the first threshold in a negative direction 1.11, which sets the tracker variable 3 to zero. A positive crossing of the first threshold shortly afterwards locks the tracker variable 3 again until the next negative crossing of the first threshold unlocks it and sets it again to zero. This is not visible as the tracker variable 3 was already zero before. Shortly afterwards the voltage waveform 1 crosses the second threshold in negative direction 1.21 which causes the tracker variable 3 to increase by "one" and to get the value 1. The trigger-condition 4 of this embodiment is the equality of the tracker variable 3 to the comparison value of 1. The comparison value is shown as dashed line in FIG. 1. The trigger-condition 4 is fulfilled at this negative crossing of the second threshold 1.21 and therefore a point of time 5 is detected. The point of time 5 is marked with a cross in FIG. 1. With the next positive crossing of the second threshold 2.2, the tracker variable becomes (−1). The following positive crossing of the first threshold 2.1 locks it again and the next negative crossing of the first threshold 2 sets it to zero.

Although not shown, one can calculate the sequence of tracker variable values occurring when the waveform oscillates around the second threshold without crossing the first threshold: 1, −1, 0, −2, −1, −3 . . . In other words: with every new oscillation, the distance between the tracker variable and the comparison value becomes greater. Only the first negative crossing of the second threshold after a negative crossing of the first threshold fulfils the trigger-condition and leads to the detection of a point of time 5.

An oscillation of the voltage waveform 1 around the first threshold locks and unlocks the tracker variable but keeps it at the constant value of 0.

Assuming, that in this embodiment, jumps are not treated as a sequence of threshold crossings and that a jump is defined as a voltage change from one sample to the next which crosses two or more thresholds at once:

A jump in the voltage from a value above the first threshold to a value below the second threshold keeps the tracker variable looked: Although the voltage may cross the second threshold, the tracker variable cannot change its values and therefore no points of times are detected until the first threshold is crossed in a negative direction again.

A jump in the voltage from below the second threshold to a voltage above the first threshold keeps the tracker variable unlocked. This is no problem if there are no further jumps in the time until the first threshold is crossed again in a negative direction, setting the tracker variable to zero again.

Assuming that, in this embodiment, jumps are defined as a voltage change between two subsequent voltage samples which crosses two or more thresholds at once and that jumps are treated as a series of threshold crossings:

A jump in the voltage from a value above the first threshold to a value below the second threshold is therefore treated as a negative crossing of the first threshold immediately followed by a negative crossing of the second threshold: This is exactly the situation in which a point of time is detected.

A jump in the voltage from a value below the second threshold to a value above the first threshold is therefore treated as a positive crossing of the second threshold immediately followed by a positive crossing of the first threshold: The tracker variable would be reduced by 2 and then locked. The trigger-condition cannot be fulfilled in this way and no point of time is detected.

The difference between the two ways of treating jumps is therefore if a sudden voltage drop should cause a detection of a point of time or not. Treating a jump as a sequence of threshold crossings may be reasonable if there is a chance that the sampling rate is slow compared to the fundamental frequency. Having two thresholds with the same sign and a risk of black-outs or brown-outs, ignoring jumps may improve the estimate for properties of the undisturbed voltage signal.

If the amplitude of possible harmonics is a priori difficult to estimate, increasing the distance between the two thresholds decreases the probability of false detections due to crossings of all thresholds by harmonics and improves therefore the robustness of the method. On the other hand, the thresholds should be chosen so that they are crossed during nominal operations. Choosing two thresholds with the same sign helps to detect measurements including black-outs.

Figure 2:
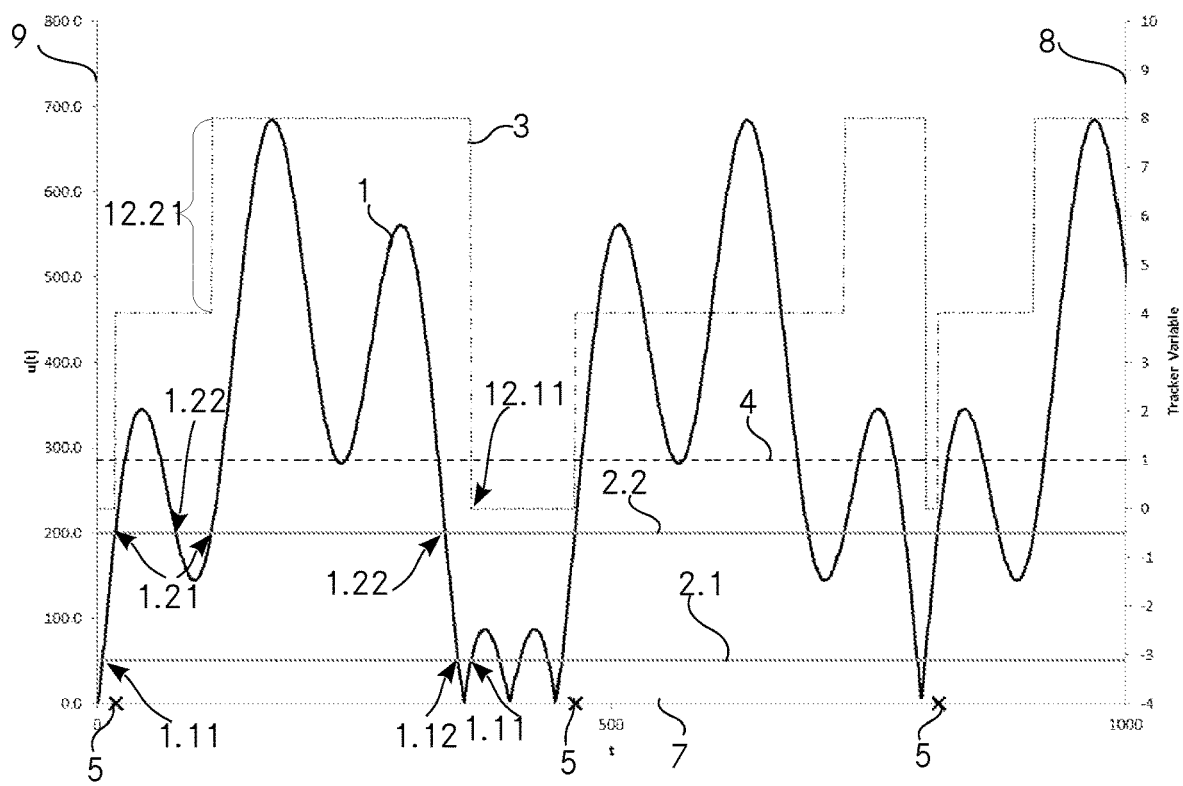

FIG. 2 shows a illustrates a second embodiment of a method for estimating a property of a voltage u(t).

The setup of the diagram is the same as in FIG. 1. However the voltage 1 is rectified. Further, the thresholds, the weighting values and the trigger-condition are different.

The first threshold 2.1 is at the positive voltage but lower than the second threshold 2.2. A positive crossing of the first threshold 6.11 sets the tracker variable 3 to 0. A positive crossing of the second threshold 6.21 adds 4 to the tracker variable 3 and a negative crossing of the second threshold 6.22 adds 0 to the tracker variable 3. The trigger-condition 4 is that the tracker variable 3 should be greater than 1 for the first time after being less or equal to 1.

Again, an oscillation of the voltage 1 around the first threshold 2.1 keeps the tracker variable at zero.

An oscillation of the voltage 1 around the second threshold 2.2 increases the tracker variable further and further. Therefore the trigger-condition keeps being fulfilled and no new points of time are detected.

In this embodiment it is assumed that, a jump is a voltage change between two samples which crosses two or more thresholds at once.

Ignoring voltage jumps prevents again the detection of points of time:

A voltage jump from a voltage above the second threshold to a voltage below the first threshold does not change the tracker variable differently from what regular negative crossings of the second and the first threshold would do.

A voltage jump from a voltage below the first threshold to a voltage above the second threshold causes that the tracker variable is not set back to zero and that nothing is added. However, as the trigger-condition was already fulfilled because it was not set back to zero, the missing addition of the first weighting value to the tracker variable does not change the trigger-condition. Therefore no new points of time are detected.

If jumps are treated as a sequence of threshold crossings on the other hand, a point of time would be detected in a jump from below the first threshold 2.1 to above the second threshold 2.2.

While the distance between two points of time is approximately the period of the fundamental in the embodiment of FIG. 1, it is approximately half of the period of the unrectified fundamental in the embodiment of FIG. 2.

Figure 3A:
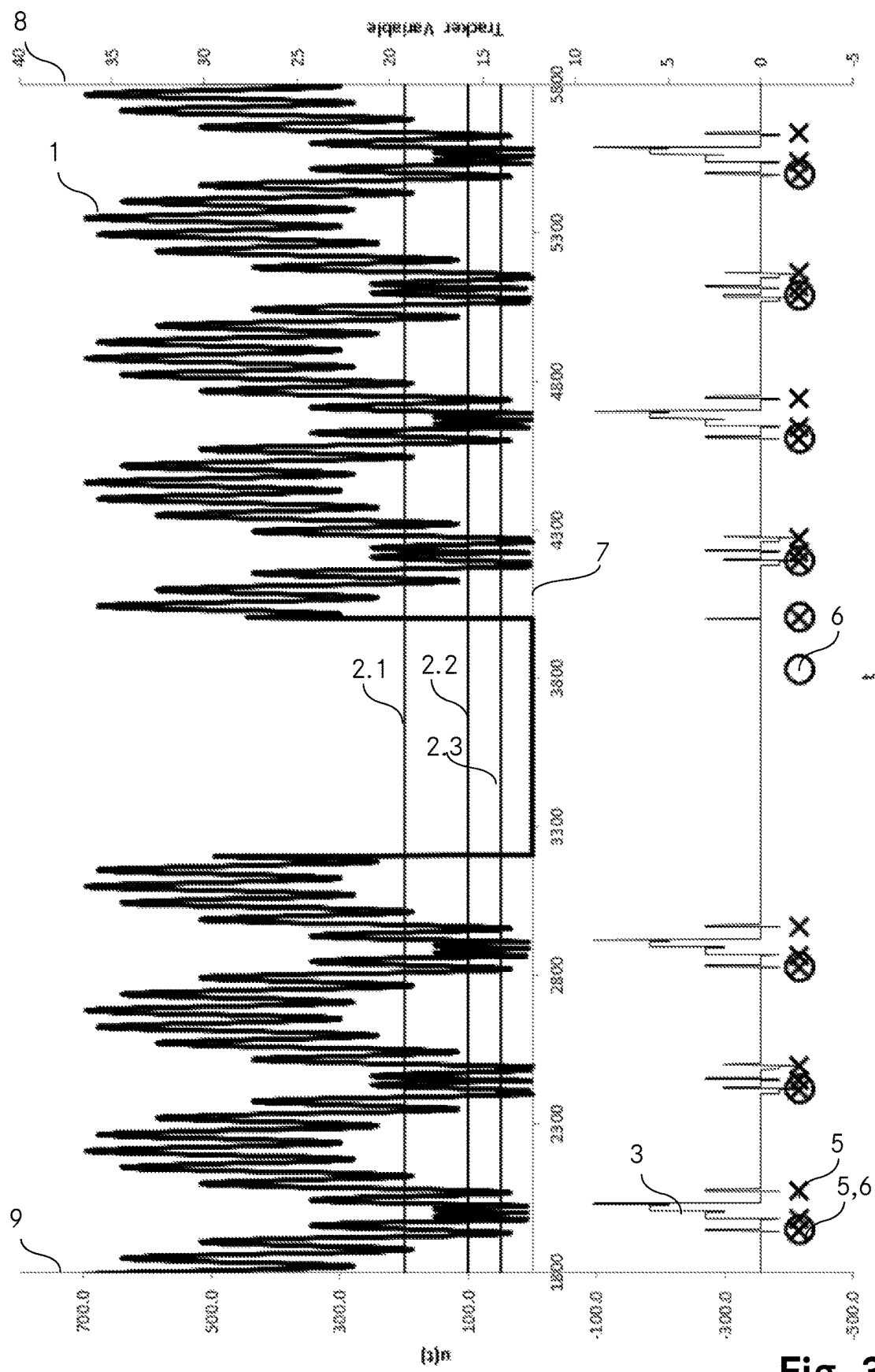
Figure 3B:
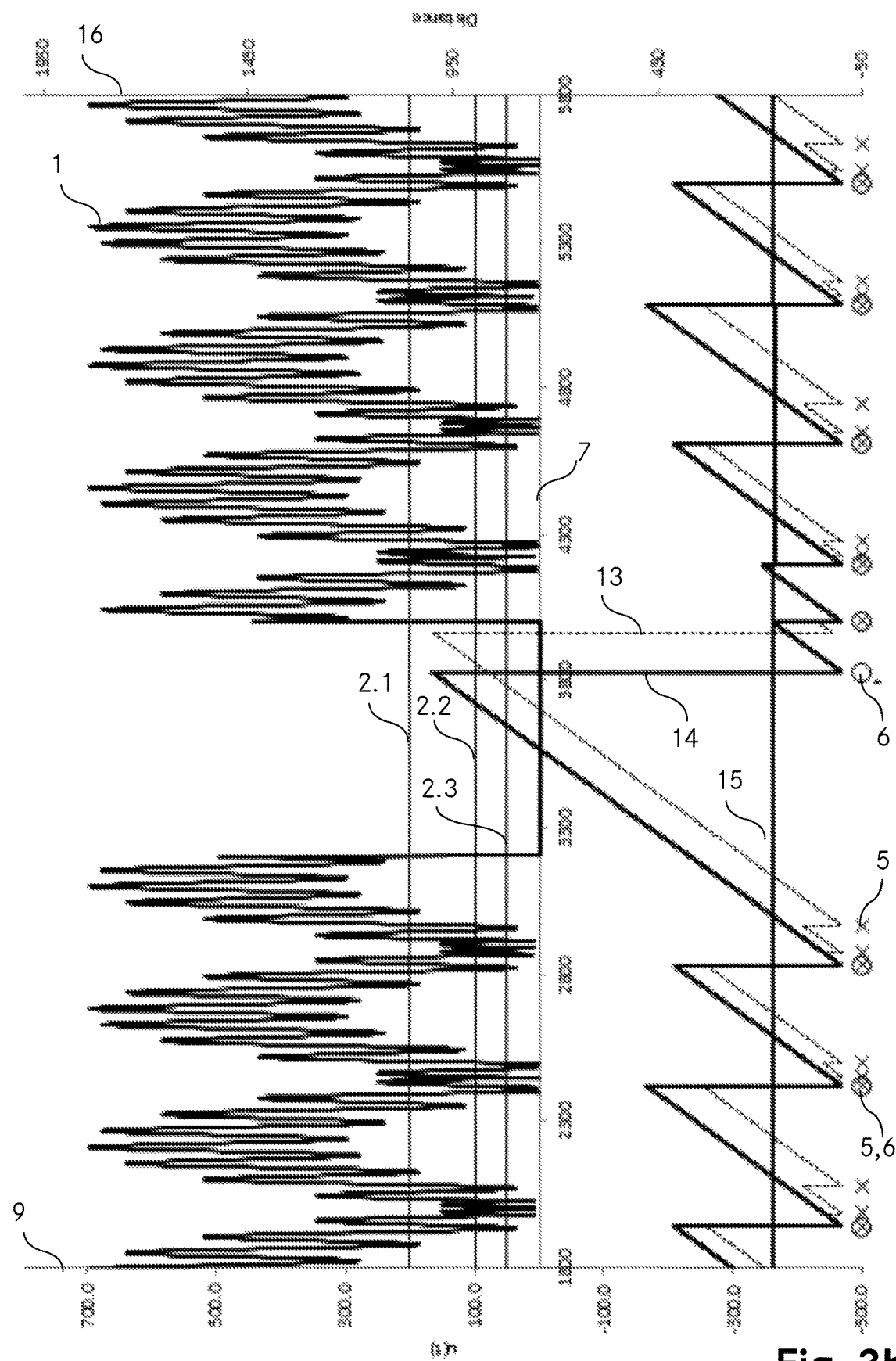

FIGS. 3a and b illustrate the idea and the method to determine reliable points of time 5.1. FIGS. 3a and b show the same voltage waveform and the same thresholds. FIG. 3a shows in addition the tracker variable 3. FIG. 3b shows instead the distances to the last point of time 5 and to the last reliable point of time 6 as well as the sliding and weighted half-period 15.

The voltage waveform 1 in FIGS. 3a and b is a rectified fundamental with a $16^{th}$ harmonic whereby the amplitude of the $16^{th}$ harmonic is 40% of the fundamental's amplitude.

There are three thresholds: the first threshold 2.1 is at the highest voltage of these thresholds and a positive crossing of it unlocks the tracker variable 3 and sets it to zero while a negative crossing does not change the tracker variable 3.

The second threshold 2.2 has a voltage between the first 2.1 and the third threshold 2.3. Crossing it in positive direction adds 4 to the tracker variable 3 while crossing it in negative direction adds 0 to the tracker variable 3.

The third threshold 2.3 is at the lowest voltage of all thresholds but still greater than zero. Crossing it in positive direction adds 0 to the tracker variable 3 while crossing it in negative direction adds (−1) to the tracker variable 3.

The trigger-condition is that a point of time 5 is detected if the tracker variable 3 rises above or to 1 after being smaller before.

As a result, a point of time 5 is detected if the second threshold 2.2 is crossed in positive direction after a positive crossing of the first threshold 2.1 and with less than four positive crossings of the third threshold 2.3 in between. This can be seen in FIG. 3a.

Due to the shape of the voltage waveform 1 and the choice of the thresholds, multiple points of time 5 are detected around every crossing of 0-Volt of the fundamental of the voltage waveform 1.

Looking at the distribution of points of time 5 along the time axis 7, there are therefore clusters around the crossings of 0-Volt separated by intervals of approximately one half-period of the fundamental.

In order to estimate voltage properties, one assumes that the distance 13 between two subsequent points of time 5 is approximately one half-period of the fundamental in the case of a rectified voltage waveform 1. This assumption is in the case shown in FIG. 3 obviously wrong in most situations. In order to improve this, the points of time 5 are filtered to determine which ones of them are reliable 6.

This filter consists of a register containing a fixed number of entries. If a point of time 5 is detected, all entries of the register are shifted by one and the distance 13 between the newly detected point of time and the previous one is written in the first entry of the register. This distance 13 is indicated by the peaks of the dashed line in FIG. 3b. Thereby, the value of the oldest entry before the detection of the new point of time 5 is lost. However, preferably this change in the register is only performed if the distance 13 between the newly detected point of time and the previous one is in an interval between a minimal and a maximal distance. This prevents, in the case shown in FIG. 3b, that the sliding and weighted half-period 15 increases after the peak in the distance 13 to the previous point of time at the end of the black-out. The distance value of 1000 at which first the reliable point of time 6 is detected and shortly afterwards distance 13 from the last point of time is reduced, is the maximum distance in this embodiment.

The largest entry of this register is divided by a divider Div. The divider Div is here larger or equal to one. The result of this calculation is preferably compared to the minimal distance. The larger one of these two values is called the sliding and weighted half-period 15. This value is shown in FIG. 3b: The sliding and weighted half-period 15 is essentially constant. In the case shown here, Div is set to 2 which is why its value is so far off the maximum value of the distances 13 between to subsequent points in time 5.

In parallel, the distance 14 of the newly detected point of time 5 to the last reliable point of time 6 is determined. In FIG. 3b this distance 14 is shown as the peaks of the continuous line except for the one of 1000. If the distance 14 to the last reliable point of time 6 is larger than the sliding and weighted half-period 15 and a point of time 5 is detected, this point of time 5 is assumed to be reliable 6.

However there is in parallel also another way to determine a reliable point of time 6: The distance 14 of the momentary time to the last reliable point of time 6 is monitored, too. In FIG. 3b this distance 14 of the momentary time to the last reliable point of time 6 is shown as the continuous line. If this distance 14 is equal to a maximum distance, in the shown embodiment the maximum distance is 1000, a reliable point of time 6 is detected, even if there is no point of time 5. This reliable point of time 6 which is no point of time 5 is in FIGS. 3a and 3b marked with a circle without a cross in it.

In FIGS. 3a and b, the register is always filled with short and long distances 13. The long distances 13 are slightly shorter than one half period of the fundamental. Therefore the sliding and weighted half period 15 is in this region also only slightly shorter than one half period of the fundamental divided by the divider Div, being 2 in this case. The points of time 5 around a single crossing of 0-Volt of the fundamental are in much smaller distances 13 to each other and are therefore no "reliable points of time". However the first point of time 5 of the next "cluster" is about one half-period away from the last reliable point of time 6 and is therefore detected as being a reliable point of time 6.

Following these first three crossings of 0-Volt of the fundamental, the voltage 1 drops to zero and stays there for a time greater than one half period. No points of time 5 are detected. However, the distance 14 of the momentary time to the last reliable point of time increases and reaches finally the maximum distance of 1000: A reliable point of time 6 is "detected" at a position where there is no point of time 5.

After this zero-voltage region is one reliable point of time 5 found which does not fit in the regular pattern seen before the zero-voltage region. This is because the jumps at the beginning and the end of the zero-voltage region are treated as a sequence of threshold crossings. In this embodiment, a jump is a voltage change between two samples which crosses two or more thresholds at once. Further, the sliding and weighted half-period 15 is quite small compared to the half-period of the fundamental and by chance, the distance 14 between the point of time 5 and the last reliable point of time 6 is just long enough to fulfil the criteria for finding a reliable point of time 6.

Due to this, in principle wrongly found, reliable point of time 6, the distance 14 to the next point of time 5 is also quite small. Nevertheless, it is correctly recognised in this case due to the small value of the sliding and weighted half-period 15.

By reducing the divider Div the sliding and weighted half-period 15 increases and reduces the chances of wrongly detecting reliable points of time 6. However, if there is such a wrong detection, it may take more regular half-periods until reliable points of time 6 are correctly detected again.

Also the maximum distance is a free parameter which can be chosen: If the value is set too small, a low fundamental frequency cannot be detected. On the other hand, if the value is to large, a longer black-out will not be detected as such but enter the register as long distance 13 between two points of time. This may increase the sliding and weighted half-period 15 to an unrealistic high value so that reliable points of time 6 are missed. However, this problem disappears as soon as the large value leaves the register. A suitable size of the register may be chosen to limit this problem.

Figure 4:
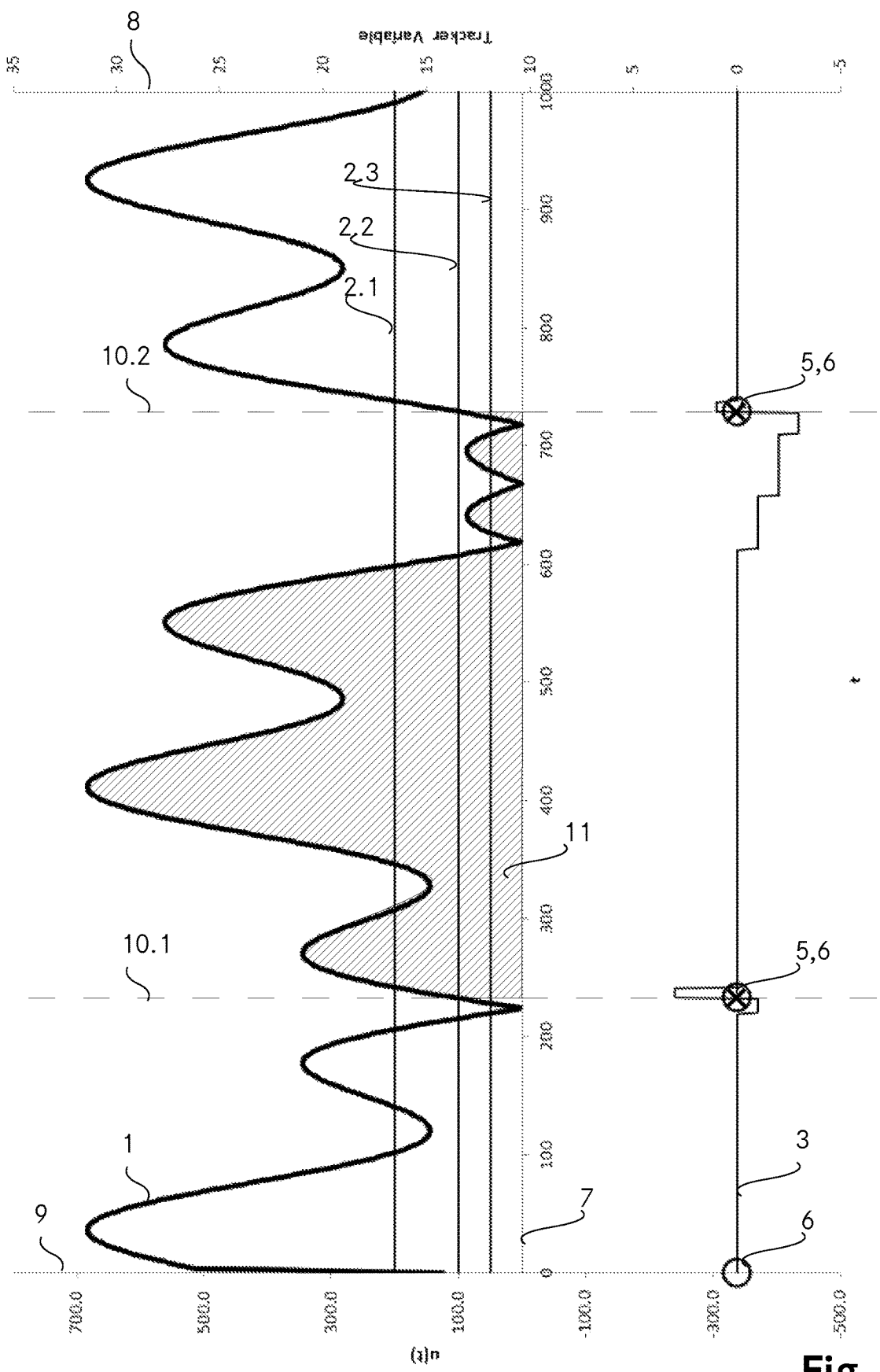

FIG. 4 shows another embodiment of a method for estimating a property of a voltage u(t).

The setup of the diagram is the same as in FIG. 2. Again, the voltage 1 is rectified. The thresholds, the weighting values and the trigger-condition differ from FIGS. 1 and 2:

The first threshold 2.1 is the one with the highest voltage value. The second threshold 2.2 has a lower voltage than the first but is still greater than the third threshold 2.3.

Crossing the first threshold 2.1 in positive direction causes the tracker variable 3 to be initialized and set to zero. Crossing the first threshold 2.1 in a negative direction has no effect of the tracker variable 3. The first direction is therefore the positive direction in this embodiment.

Crossing the second threshold 2.2 in a positive direction causes the first weighting value of 4 to be added to the tracker variable 3. Crossing the second threshold 2.2 in a negative direction causes the second weighting value of 0 to be added to the tracker variable 3.

Crossing the third threshold 2.3 in a positive direction causes the third weighting value of 0 to be added to the tracker variable 3. Crossing the third threshold 2.3 in a negative direction causes the fourth weighting value of −1 to be added to the tracker variable 3.

The trigger-condition 4 is fulfilled if the tracker variable 3 is greater or equal to one for the first time after being smaller than one.

This choice of weighting factors and thresholds has the effect that many oscillations around the third and lowest threshold 2.3 can prevent tracker variable 3 from reaching the trigger-condition 4. There is no need to cross the third and lowest threshold 2.3 to reach the trigger-condition 4. Such a choice of weighting factors and thresholds may be useful in situations where many oscillations at low voltages are an indication of a problem or an otherwise special situation.

The waveform shown in FIG. 4 does not have enough oscillations around the third and lowest threshold 2.3 in order to prevent the tracker variable 3 from reaching the trigger-condition. Therefore two point of time 5 are detected during the observed time. Both points of time 5 are identified to be reliable points of time 6. In order to estimate a voltage property like the average voltage, the voltage values 1 are integrated over the time between the two subsequent points of time 5. This is the integral 11. The lines 10.1 and 10.2 indicate the points of time 5.

Figure 5A:
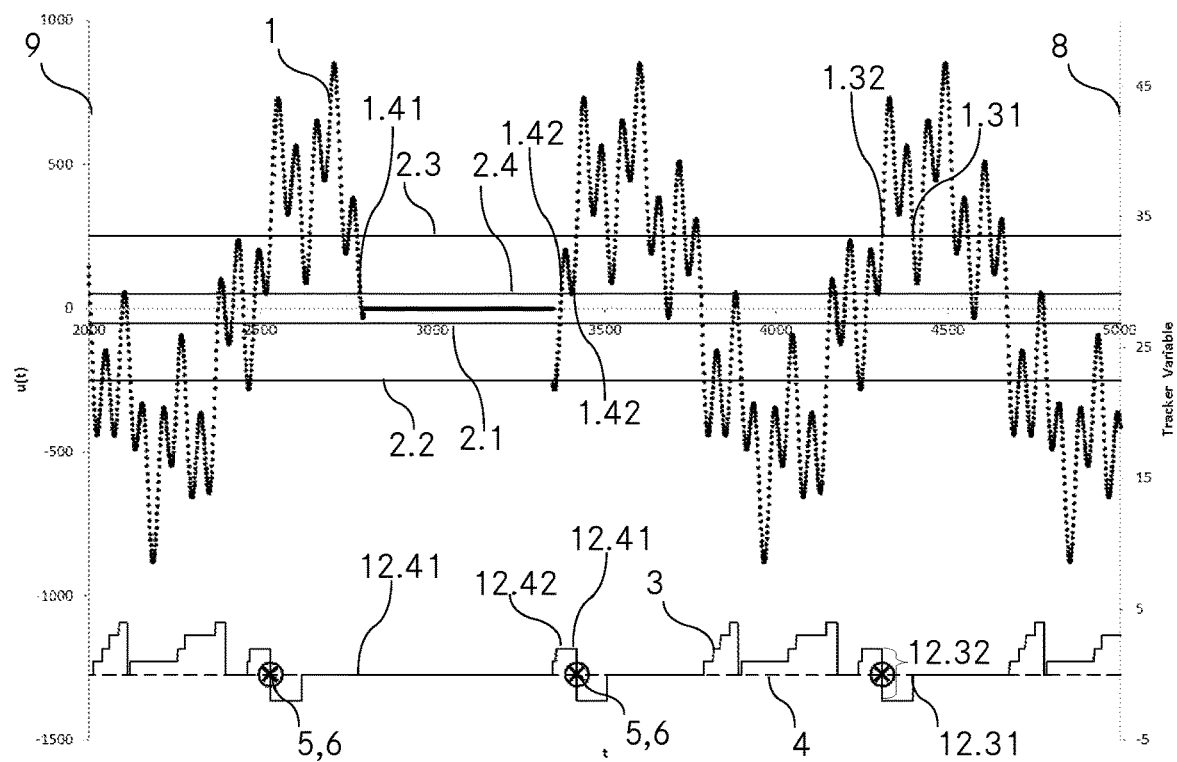
Figure 5B:
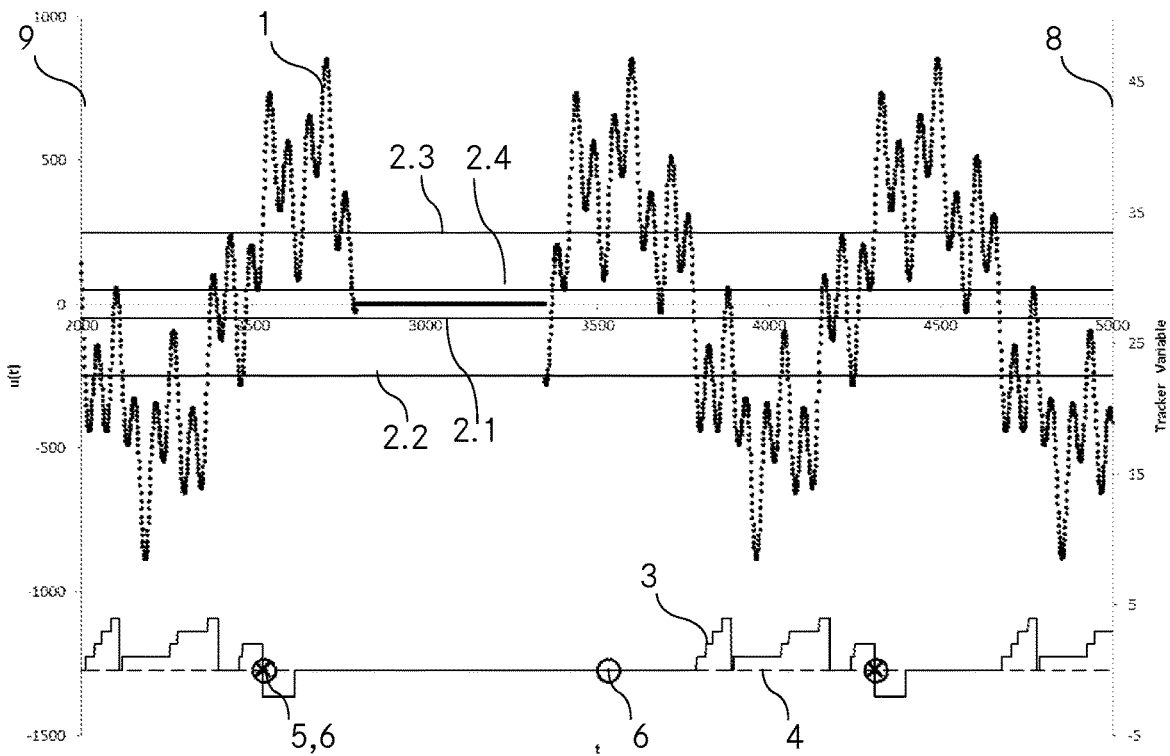

FIGS. 5a and 5b show two evaluations of the same voltage waveform 1 with the same thresholds, weighting values and trigger-condition. The two figures differ in the way jumps are treated: In FIG. 5a a jump is treated as a sequence of threshold crossings, in FIG. 5b a jump does not influence the tracker variable. In both cases, a jump is a voltage change between two samples which crosses two or more thresholds at once, in this embodiment.

The voltage waveform 1 is a fundamental together with its sixth and sixteenth harmonic. The amplitudes of both harmonics are 40% of the fundamental's amplitude. Further there is a time during which the voltage drops to zero before continuing as before, simulating a black-out.

In FIGS. 5a and 5b the waveform 1 is depicted by many points indicating the individual sampled voltage values. Thereby, the jump at the end of the black-out becomes clearly visible.

The first threshold 2.1 is in this embodiment at −50 V and a positive crossing locks the tracker variable 3 while a negative crossing unlocks the tracker variable and sets it to zero.

The second threshold 2.2 is in this embodiment at −250 V and both, a positive and a negative crossing add one to the tracker variable 3.

The third threshold 2.3 is at 250 V and a positive crossing (2.32) multiplies the tracker variable 3 with (−1) (12.32) while a negative crossing (2.31) multiplies it with zero (12.31).

A fourth threshold 2.4 located at 50 V and a positive crossing (2.42) unlocks the tracker variable (12.42) while a negative crossing (2.41) locks it (12.41).

The trigger-condition is that the tracker variable is smaller than zero for the first time after being greater or equal to zero. Therefore a point of time 5 is detected if the second threshold 2.2 was crossed followed by a positive crossing of the third threshold 2.3 and without any negative crossing if the first threshold 2.1 in between.

At the end of the black-out, the voltage jumps from zero, located between the first 2.1 and the fourth threshold 2.4 to below the second threshold 2.2. This is a jump in this embodiment, because two thresholds are crossed at once. The jumped-over thresholds are the first 2.1 and the second threshold 2.2 and the jump is in negative direction.

In FIG. 5a, the jump is treated as a negative crossing of the first threshold 2.1, unlocking the tracker variable 3 and setting it to zero, followed by a negative crossing of the second threshold, adding one to the tracker variable 3. Therefore the value of the tracker variable 3 equals one after the jump.

In FIG. 5b, the jump does not change the tracker variable 3. As the fourth threshold 2.4 was crossed in negative direction just before the blackout, the tracker variable 3 was locked and is still locked when the black-out ends. Due to the jump, there is no threshold crossing which unlocks the tracker variable 3 again and therefore its value equal 0 and it stays locked until the fourth threshold 2.4 is crossed in positive direction of until the first threshold 2.1 is crossed in a negative direction.

This difference between FIGS. 5a and 5b results in a point of time 5 being detected in FIG. 5a, but being not detected in FIG. 5b. As a consequence, the distance 13 between two detected points of time 5 is in FIG. 5b so large, that a reliable point of time 6 is inserted by the method in between the two detected points of time 5.

Figure 6:
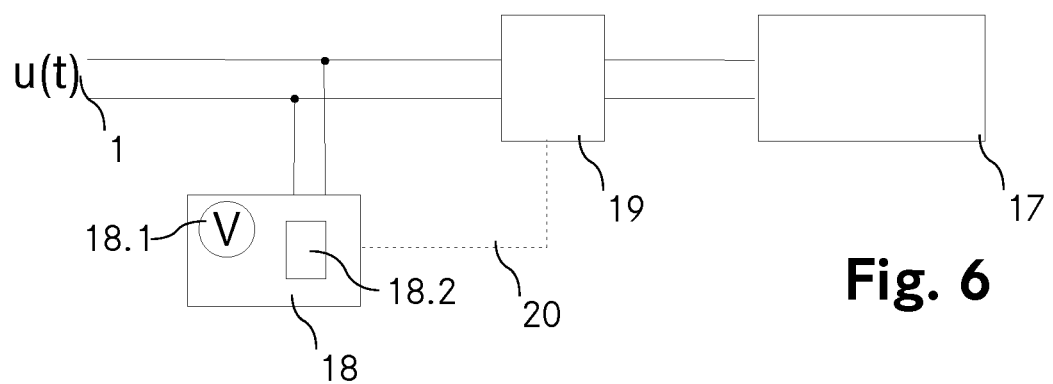

FIG. 6 shows an electronic device which uses the method for estimating a voltage property. A voltage u(t) 1 is delivered to the electronic device. In this case the electronic device is a power supply. The power supply consists of a conventional power supply 17, a measurement and evaluation device 18 and a correction device 19. Before the conventional power supply 17 the voltage u(t) is measured by a voltmeter 18.1 and the method for estimating a voltage property is executed in real time by subdevice 18.2. Both, the voltmeter 18.1 and the subdevice 18.2 are part of the measurement and evaluation device 18. The measurement and evaluation device 18, in particular its subdevice 18.2, contains either a suitable analogue circuitry or suitable digital devices like microprocessors or a mixture of both. The measurement and evaluation device 18 measures the voltage u(t) and executes the method for estimation of a voltage property. The resulting estimated voltage properties are delivered via a signal channel 20 to the correction device 19 which protects the conventional power supply 17 from input voltages with critical properties. The signal channel 20 can transmit the estimated voltage property with a wire or wireless.

In other embodiments, only an indicator signal is transmitted to the correction device 19 or the conventional power supply 17 itself. The indicator signal may indicate that one or more voltage properties are critical. It is also possible that one or more of the voltage properties are transmitted to the conventional power supply device 17 itself. The correction device 19 may be included in the measurement and evaluation device 18 and one or both may be included in the conventional power supply 17. It is also possible that the voltmeter 18.1 and the subdevice 18.2 are integrated in a single unit or that they are separated and integrated in different devices or being single units. Further, the voltage property estimate or an indicator signal indicating a critical value of one of more voltage properties may be transmitted to a storage device or to a supervisor.

An electronic device which uses the method for estimating a current property is similar to the one shown in FIG. 6, but the voltmeter 18.1 is replaced by an ampere meter which is placed in the current path of interest. An electronic device which uses the method for estimating a power property may comprise both, a voltmeter 18.1 and an ampere meter and multiply the two values to evaluate a power signal. In another embodiment, it comprises a power meter instead of the voltmeter 18.1. One way of producing an energy signal is to integrating a power signal over a fixed duration. Electronic devices with use the method for estimating other signal properties replace the voltmeter 18.1 with a measurement device for the desired signal: e.g. a hall-sensor for a magnetic field signal, a thermocouple for a temperature signal. Of course, it is also possible to use sensors based on other measurement principles, too.

In summary, it is to be noted that the method can be used for alternating voltages as well as for rectified voltages. The choice of the amount of thresholds, their values, the weighting factors and the mathematical operations shown in the different embodiments are only examples: They can be adapted to the needs of the application in which the method should be used.

LIST OF REFERENCE SYMBOLS

1   Sensed Voltage u(t)
1.11  Crossing of first threshold in first direction
1.21  Crossing of second threshold in first direction
1.12  Crossing of first threshold in second direction
1.22  Crossing of second threshold in second direction
1.31  Crossing of third threshold in first direction
1.32  Crossing of third threshold in second direction -continued 1.41 Crossing of fourth threshold in first direction
1.42 Crossing of fourth threshold in second direction
2.1 First threshold
2.2 Second threshold
2.3 Third threshold
2.4 Fourth threshold
3 Tracker variable
4 Trigger condition
5 Point of time
6 Reliable Point of time
12.11 Set tracker variable to starting value (bei $1^{st}$ threshold in $1^{st}$ direction) [FIG. 1]
12.12 Locking of tracker variable (bei $1^{st}$ threshold in $2^{st}$ direction)
12.21 First weighting value (bei $2^{nd}$ threshold in $1^{st}$ direction) [FIG. 1, 2]
12.22 Second weighting value (bei $2^{nd}$ threshold in $2^{st}$ direction)[FIG. 1]
12.31 Modify fourth weighting value (bei $3^{rd}$ threshold in $1^{st}$ direction) [FIG. 5a]
12.32 Modify by fifth weighting value (bei $3^{rd}$ threshold in $2^{st}$ direction) [FIG. 5a]
12.41 fourthprotecting tracker variable (bei $4^{rd}$ threshold in $1^{st}$ direction) [FIG. 5a]
12.42 fourthAllowing changes of tracker variable (bei $4^{rd}$ threshold in $2^{st}$ direction) [FIG. 5a]
7 Time axis
8 Axis for tracker variable and trigger condition
9 Axis for sensed signal u(t) curve
10.1, Orientation lines
10.2
11 Integral over signal between two subsequent reliable points of time
13 Distance from the last point of time
14 Distance from the last reliable point of time
15 Sliding and weighted half-period (SWHP)
16 Axis for distances and SWHP
17 Conventional power supply
18 Measurement and evaluation device;
18.1 Voltmeter
18.2 subdevice
19 Correction device
20 Signal channel

The invention claimed is:

1. A method for protection of a switched mode power supply,
   a) whereby a property of a signal x(t) sensed in an electrical system is estimated by
      i) sensing the signal;
      ii) estimating a fundamental period of a fundamental of the signal by
         (1) comparing the sensed signal with at least one threshold to detect threshold crossings, and
         (2) estimating the fundamental period from the threshold crossings;
   b) initializing a tracker variable with a starting value when the signal crosses a first threshold in a first direction;
   c) modifying the value of the tracker variable by a first mathematical operation linking a first weighting value and the value of the tracker variable when the signal crosses a second threshold in the first direction;
   d) modifying the value of the tracker variable by a second mathematical operation linking a second weighting value and the value of the tracker variable when the signal crosses the second threshold in a second direction;
   e) defining at least two points of time $E_{i-1}$, $E_i$, at which the value of the tracker variable fulfils a trigger-condition;
   f) estimating the signal property based on a) a distance in time between two subsequent points of time, Di=Ei–Ei–1 and/or b) the signal x(t) sensed between two subsequent points of time;
   and
   g) whereby the estimated property of the signal is used to protect the switched mode power supply by adapting internal switching frequencies or switching parts of the switched mode power supply off.

2. The method according to claim 1, whereby the sensed signal is compared with two or more thresholds to detect the threshold crossings.

3. The method according to claim 1, comprising the step of integrating a function f(x(t)) corresponding to the signal x(t), over time between the two points of time $E_n$, $E_m$.

4. The method according to claim 1, whereby the trigger-condition is an equality of the value of the tracker variable and a comparison value.

5. The method according to claim 1 whereby,
   a) the first and the second threshold are both at a positive signal value and the first threshold is greater than the second threshold,
   b) the first direction is negative,
   c) the second direction is positive.

6. The method of claim 1 further including a method for creating an event record, whereby the points of time are stored in an event record, wherein the event record comprises a list of all detected point of time $E_i$.

7. The method of claim 1 further including a method for creating a distances record, comprising the steps of
   a) sorting the points of time by ascending time of occurrence and numbering the points of time in order with the ascending time of occurrence, thereby assigning each point of time a number, if the numbers of the points of times or numbers of distances are stored in the distance record,
   b) determining distances D between every two subsequent points of time $E_i$, $E_{i-1}$ by subtracting an earlier point of time from a later point of time,
   c) assigning each distance $D_i$ a number equal to the number of the later point of time, if the numbers of distances are stored in the distance record,
   d) storing the distances $D_i$ in the distances record,
      a. which is ordered and the distances are stored in the order of the occurrence of the earlier or the later of the two points of time between which the respective distance was evaluated
      or
      b. which comprises data-tuples and each data-tuple comprises one of the distances and the number of the earlier or the later of the two points of time between which the respective distance was evaluated
      or
      c. which is ordered and the distances are stored in the order of the numbers of the distances
      or
      d. which comprises data-tuples and each data-tuple comprises one of the distances and the number of the one of the distances which is comprised in the respective data-tuple.

8. The method of claim 7 further including a method for determining a sliding and weighted half period of a distance $D_X$, comprising the steps of:
   a) determining distances $D_0, \ldots D_X$, or reading the distances record,
   b) setting a value of the sliding and weighted half period at distance $D_X$ (SWHP($D_X$)) to a maximum value of a list containing a. a fixed quantify A of distances $D_i$ divided by a divider Div,
  i. whereby
    1. the distances $D_i$ have a number smaller or equal to the number of $D_X$
    2. or the distances $D_i$ are in a sorted distances record in time before or at the same record as the distance $D_X$,
    3. or the distances $D_i$ occur before or at the distance $D_X$
b. and a minimum distance, $D_{min}$.

9. The method of claim 8 further including a method for determining if a distance is reliable, comprising the steps of:
  a) determining distances $D_0, \ldots D_X$ or by reading the distances record,
  b) determining a distance Y between a first distance $D_{X+1}$ with the number $Nr(D_{X+1})$ and a second distance $D_{Fi}$ with the number $Nr(D_{Fi})$,
    a. by addition of all distances with numbers between the number of the second distance $D_{Fi}Nr(D_{Fi})$ plus+1 and the number of the first distance $D_{X+1}$ $Nr(D_{X+1})$,
    b. whereby the second distance $D_{Fi}$ is a reliable distance and whereby the second distance $D_{Fi}$ has the largest number of all reliable distances which is smaller than the number of the first distance $D_{X+1}$ $Nr(D_{X+1})$,
  c) defining the first distance $D_{X+1}$ to be reliable if
    a. the distance Y is larger or equal the sliding and weighted half period at the first distance $D_{X+1}$, (SWHP($D_{X+1}$)),
    or
    b. if the distance Y is larger than a maximum distance $D_{max}$.

10. The method according to claim 9, whereby the signal property to be estimated is an effective signal $X_{eff}$, which is estimated by
  a) integrating the square of the sensed signal x(t) between the later one of the two points of time used to evaluate a first distance $D_m$ and the later one of the two points of time used to evaluate a second distance $D_n$, and by
  b) dividing this integrated signal through the distance between the first and the second distance.

11. The method of claim 10 further including determining an improved effective signal $X_{eff,imp}$, whereby a floating average of an even number of subsequent effective signal values $X_{eff}(E_{m0},E_{n0}), X_{eff}(E_{m1},E_{n1}), \ldots, X_{eff}(E_{mx},E_{nx})$ as estimated according to claim 10 is calculated by
  a) addition of the subsequent effective signal values and
  b) division by the number of added effective signal values,
  c) whereby a first relationship between the two points in time ($E_{mi},E_{ni}$), between which each one of the involved subsequent effective signals is determined, is the same for all involved subsequent effective signal values, and
  d) whereby all of the points of time (5) ($E_{m0},E_{m1}, \ldots, E_{mx}$) which are the earlier ones of the two points in time, between which one of the involved subsequent effective signals is determined, are in a second relationship towards each other.

12. The method according to claim 9, whereby the signal property to be estimated is a characteristic number for the amount of harmonic content H, which is evaluated by
  a) using
    a. the number and/or the distribution of points of time and/or
    b. the number and/or the differences of the reliable distances.

13. The method according to claim 1 whereby the signal x(t) is a voltage signal u(t) or a current signal i(t) or a power signal w(t).

14. The method of claim 6 further including a method for creating a distances record, comprising the steps of
  a) collecting points of time by reading the event record,
  b) sorting the points of time by ascending time of occurrence and numbering the points of time in order with the ascending time of occurrence, thereby assigning each point of time a number, if the numbers of the points of times or numbers of distances are stored in the distance record,
  c) determining distances $D_i$ between every two subsequent points of time $E_i$, $E_{i-1}$ by subtracting an earlier point of time from a later point of time,
  d) assigning each distance $D_i$ a number equal to the number of the later point of time, if the numbers of distances are stored in the distance record,
  e) storing the distances $D_i$ in the distances record,
    a. which is ordered and the distances are stored in the order of the occurrence of the earlier or the later of the two points of time between which the respective distance was evaluated
    or
    b. which comprises data-tuples and each data-tuple comprises one of the distances and a number of the earlier or the later of the two points of time between which the respective distance was evaluated
    or
    c. which is ordered and the distances are stored in the order of numbers of the distances,
    or
    d. which comprises data-tuples and each data-tuple comprises one of the distances and the number of the one of the distances which is comprised in the respective data-tuple.

15. The method of claim 14 further including a method for determining a sliding and weighted half period of a distance $D_X$, comprising the steps of:
  a) determining distances $D_0, \ldots D_X$, or reading the distances record
  b) setting a value of the sliding and weighted half period at distance $D_X$ (SWHP($D_X$)) to a maximum value of a list containing
    c. a fixed quantify A of distances $D_i$ divided by a divider Div,
      i. whereby
        1. the distances $D_i$ have a number smaller or equal to the number of $D_X$
        2. or the distances $D_i$ are in a sorted distances record in time before or at the same record as the distance $D_X$,
        3. or the distances $D_i$ occur before or at the distance $D_X$
    d. and the minimum distance, $D_{min}$.

16. The method of claim 15 further including a method for determining if a distance is reliable, comprising the steps of:
  a) Determining distances $D_0, \ldots D_X$ or reading the distances record
  b) determining a distance Y between a first distance $D_{X+1}$ with the number $Nr(D_{X+1})$ and a second distance $D_{Fi}$ with the number $Nr(D_{Fi})$,
    a. by addition of all distances with numbers between the number of the second distance $D_{Fi}Nr(D_{Fi})$ plus 1 and the number of the first distance $D_{X+1}$ $Nr(D_{X+1})$,
    b. whereby the second distance $D_{Fi}$ is a reliable distance and whereby the second distance $D_{Fi}$ has the largest number of all reliable distances which is smaller than the number of the first distance $D_{X+1}$Nr ($D_{X+1}$)

c) defining the first distance $D_{X+1}$ to be reliable if
  a. the distance Y is larger or equal the sliding and weighted half period at the first distance $D_{X+1}$, (SWHP($D_{X+1}$)),
  or
  b. if the distance Y is larger than a maximum distance $D_{max}$.

17. The method of claim 16, whereby the signal property to be estimated is the effective signal $X_{eff}$, which is estimated by
  a) integrating the square of the sensed signal x(t) between the later one of the two points of time used to evaluate a first distance $D_m$ and the later one of the two points of time used to evaluate a second distance $D_n$, and by
  b) dividing the integrated signal through the distance between the first and the second distance.

18. The method of claim 17 further including a method for determining an improved effective signal $X_{eff,imp}$, whereby a floating average of an even number of subsequent effective signal values $X_{eff}(E_{m0},E_{n0})$, $X_{eff}(E_{m1},E_{n1})$, . . . , $X_{eff}(E_{mx},E_{nx})$ as estimated according to claim 17 is calculated by
  a) addition of the subsequent effective signal values and
  b) division by the number of added effective signal values,
  c) whereby a first relationship between the two points in time ($E_{mi},E_{ni}$), between which each one of the involved subsequent effective signals is determined, is the same for all involved subsequent effective signal values, and whereby all of the points of time ($E_{m0},E_{m1}, \ldots, E_{mx}$) which are the earlier ones of the two points in time, between which one of the involved subsequent effective signals is determined, are in a second relationship towards each other.

19. The method of claim 16, whereby the signal property to be estimated is a characteristic number for the amount of harmonic content H, which is evaluated by
  a) using
    a. the number and/or the distribution of points of time and/or
    b. the number and/or the differences of the reliable distances.

* * * * *